(12) United States Patent
Shizuno

(10) Patent No.: US 7,151,320 B2
(45) Date of Patent: *Dec. 19, 2006

(54) SEMICONDUCTOR DEVICE WITH IMPROVED DESIGN FREEDOM OF EXTERNAL TERMINAL

(75) Inventor: Yoshinori Shizuno, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 185 days.

This patent is subject to a terminal disclaimer.

(21) Appl. No.: 10/722,446

(22) Filed: Nov. 28, 2003

(65) Prior Publication Data

US 2004/0130022 A1 Jul. 8, 2004

(30) Foreign Application Priority Data

Jan. 8, 2003 (JP) ............................. 2003-002167

(51) Int. Cl.
H01L 23/28 (2006.01)
H01L 23/52 (2006.01)

(52) U.S. Cl. ....................... 257/787; 257/783

(58) Field of Classification Search ............... None
See application file for complete search history.

(56) References Cited

U.S. PATENT DOCUMENTS

| 6,268,648 | B1 | 7/2001 | Fukutomi et al. ........... 257/678 |
| 6,271,469 | B1 * | 8/2001 | Ma et al. .................... 174/52.4 |
| 6,455,920 | B1 | 9/2002 | Fukasawa et al. ........... 257/620 |

| 2002/0192867 | A1 | 12/2002 | Nishiyama .................... 438/110 |

FOREIGN PATENT DOCUMENTS

| JP | 11-233678 | 8/1999 |
| JP | 11-251493 | 9/1999 |
| JP | 2000-124354 | 4/2000 |
| JP | 2000-208556 | 7/2000 |
| JP | 2000-277682 | 10/2000 |
| JP | 2000-516044 | 11/2000 |
| JP | 2001-308116 | 11/2001 |
| JP | 2002-016173 | 1/2002 |
| JP | 2002-231854 | 8/2002 |

OTHER PUBLICATIONS

English-language translation of JP patent publication No. 2002-016173.

* cited by examiner

Primary Examiner—Michael Trinh
Assistant Examiner—Kiesha Rose
(74) Attorney, Agent, or Firm—Rabin & Berdo, PC

(57) ABSTRACT

A semiconductor device comprises: a semiconductor chip having a first main surface, a second main surface, and a plurality of side surfaces; an extension portion which contacts and surrounds the side surfaces of the semiconductor chip; a base, which is capable of conducting heat generated by the semiconductor chip; an insulating film which is formed on the first face and the first main surface; a plurality of wiring patterns extended from electrode pads to the upper side of the first face of the extension portion; a sealing portion which is formed on the wiring patterns and insulating film; and a plurality of external terminals provided over the wiring patterns in a region including the upper side of the extension portion.

14 Claims, 13 Drawing Sheets

SEMICONDUCTOR DEVICE WITH IMPROVED DESIGN FREEDOM OF EXTERNAL TERMINAL

BACKGROUND OF THE INVENTION

1. Field of the Invention

This invention relates to a semiconductor device and a manufacturing method therefor, and more particularly to a semiconductor device having a constitution which is capable of corresponding to further increases in the number of external terminals and a manufacturing method therefor.

2. Description of Related Art

Demands have been made in recent years for further reductions in the size and thickness of packaged semiconductor devices. In response to such demands, a packaging form known as a Wafer Level Chip Size Package (to be referred to simply as WCSP hereinafter), in which the external size of the packaging is substantially equal to the external size of the semiconductor chip, has been proposed.

A WCSP comprises a semiconductor chip. The semiconductor chip comprises a circuit element having a predetermined function and a plurality of electrode pads electrically connected to each other on the circuit element. An insulating film is formed on a first main surface such that the plurality of electrode pads are exposed.

A plurality of wiring patterns connected to the exposed electrode pads is formed on the surface of the insulating film.

Electrode posts are formed on these wiring patterns. A sealing portion is then formed so as to cover the insulating film and wiring patterns and such that the top surface of the electrode posts is exposed.

A plurality of external terminals provided as solder balls used in BGA packaging, for example, is provided on the top surface of the electrode posts.

This type of WCSP has a fan-in constitution in which the multiple external terminals are provided in a lattice formation, for example, in a region corresponding to a circuit-forming surface of the semiconductor chip.

According to the constitution of a semiconductor device disclosed in Japanese Patent Application Laid-Open Publication No. 2000-208556, to mount a semiconductor chip comprising external terminals in a fan-in configuration onto a printed board, a semiconductor chip is provided with electrode pads in order to prevent the breakage of a connecting portion between the printed board and external electrodes. Wiring connected to the electrode pads is formed in a predetermined position on the semiconductor chip. External electrodes connected to the wiring are formed in a predetermined position on the wiring. A printed board is connected to the external electrodes, and a substrate is formed on the semiconductor chip. A resin layer is provided on the substrate for aligning the thermal expansion of the substrate and printed board, and in particular, external electrodes are provided on the resin layer.

As semiconductor devices become increasingly sophisticated, the number of external terminals formed on a single packaged semiconductor device is gradually increasing. Conventionally, such demands for increases in the number of external terminals have been met by providing constitutions in which the spacing between adjacent external terminals is narrowed. As shall be described below, however, design freedom is severely restricted by the disposal pitch and disposal positions of external terminals.

In the conventional WCSP described above, the minimum gap between adjacent external terminals is set at a concrete level of approximately 0.5 mm. In the case of a 7 mm×7 mm WCSP, the number of external terminals provided is approximately 160.

In accordance with demands for further increases in the number of external terminals on a packaged semiconductor device, it is desirable that approximately 300 external terminals be provided on a 7 mm×7 mm WCSP.

It is not technically impossible in the aforementioned WCSP to form an even larger number of external terminals on the surface of the WCSP by further narrowing the gap between adjacent external terminals.

However, it is extremely difficult to form 300 external terminals on the surface area of a 7 mm×7 mm WCSP. Moreover, if the pitch between the external terminals is narrowed, an extremely high degree of technology is required to mount the WCSP onto a mounting substrate.

For example, the pitch between the plurality of external terminals may have to be formed in alignment with the mounting pitch of the mounting substrate within a range of approximately 0.3 mm to 0.7 mm.

In a conventional packaging constitution in such a case, a semiconductor chip is connected to the substrate by means of a so-called flip chip connection and the semiconductor chip is connected to the external electrodes via the substrate. Alternatively, the substrate and semiconductor chip are connected by wire bonding and the semiconductor chip is connected to the external electrode via the substrate. Since both of these connection methods utilize a substrate, and since additional sealing material is required in accordance with the height of the wire loop, the package becomes thick. Moreover, the package becomes expensive due to the cost of the substrate. The package becomes particularly expensive when a flip chip connection is used since an expensive buildup substrate is required.

Meanwhile, when connection is performed by means of wire bonding, the inductance of the wire part increases.

In addition, recent advances in the miniaturization of the semiconductor device manufacturing process and the high degree of heat generation in the semiconductor device caused by the large scale integration of circuit elements are striking. When peripheral structures and the semiconductor device itself are exposed to the high temperatures caused by heat generation, malfunctions may occur, for example.

An object of this invention is therefore to provide a semiconductor device having a constitution in which design freedom in the disposal pitch and disposal positions of external terminals is increased, in which the package itself can be made compact, and in which heat generated by a semiconductor chip can be dispersed into the atmosphere (including the atmosphere of a space of a fixed area which surrounds the semiconductor device. Similar below.).

SUMMARY OF THE INVENTION

In order to achieve this object, a semiconductor device of this invention has the following constitution. That is, the semiconductor device of this invention comprises a semiconductor chip having a first main surface on which a plurality of electrode pads is provided, a second main surface which opposes the first main surface, and a plurality of side surfaces positioned between the first main surface and second main surface.

An extension portion comprises a first face and a second face opposing the first face. The extension portion contacts the side surfaces of the aforementioned semiconductor chip so as to surround the semiconductor chip, and the first face is formed at a substantially identical level to the level of the first main surface.

The semiconductor device of this invention further comprises a base. The base comprises a first surface and a second surface, which opposes the first surface. The first surface contacts and thus supports the second face of the extension portion and the second main surface of the semiconductor chip. The base functions to conduct (absorb) heat generated by the semiconductor chip such that this heat is dispersed into the atmosphere from the second surface.

An insulating film is formed on the first face and first main surface such that a part of each of the plurality of electrode pads on the semiconductor chip is exposed.

A plurality of wiring patterns is electrically connected to the electrode pads, respectively and extended from the electrode pads to the upper side of the first face of the extension portion.

A sealing portion is formed on the wiring patterns and insulating film such that a part of each of the wiring patterns is exposed.

The semiconductor device of this invention further comprises a plurality of external terminals provided over the wiring patterns in a region including the upper side of the extension portion.

According to the constitution of the semiconductor device of this invention, external terminals can also be provided on the upper side of the extension portion which is provided in contact with and surrounding the semiconductor chip, and thus a semiconductor device having increased design freedom in the disposal pitch, disposal positions, and so on of the external electrodes can be provided. Further, the semiconductor device of this invention may be constructed without the use of an interposer such as a substrate by applying a so-called WCSP manufacturing process, as a result of which increases in operating speed, functional sophistication, number of functions, and compactness can be achieved in comparison with a wire bonding connection. Moreover, an identical electrical characteristic can be obtained at a lower cost than a device in which a flip chip connection is used.

Moreover, the semiconductor device of this invention is capable of dispersing heat generated by the semiconductor chip into the atmosphere surrounding the semiconductor chip via the base which is formed in consideration of thermal radiation, and thus defects such as malfunctions caused by heat can be prevented.

A manufacturing method preferably comprises the following manufacturing steps.

A manufacturing method of the semiconductor device comprises the steps of:

(1) setting a plurality of semiconductor chip disposal regions on which a plurality of semiconductor chips is to be disposed at predetermined intervals on a base comprising a first surface and a second surface which opposes the first surface, and forming a construction for aiding singularization so as to surround the semiconductor chip disposal regions;

(2) providing a semiconductor chip having a first main surface on which a plurality of electrode pads is provided, a second main surface which opposes the first main surface, and a plurality of side surfaces positioned between the first main surface and second main surface on the semiconductor chip disposal region such that the second main surface faces the semiconductor chip disposal region;

(3) forming an extension portion having a first face and a second face which opposes the first face on the base so as to contact the side surfaces of the semiconductor chip and thereby surround the semiconductor chip, and such that the level of the first face is substantially equal to the level of the first main surface;

(4) forming an insulating film on the first face of the extension portion and the first main surface such that a part of each of the electrode pads is exposed;

(5) forming a plurality of wiring patterns on the insulating film so as to be electrically connected to the electrode pads, respectively and extended from the electrode pads to the upper side of the first face of the extension portion;

(6) forming a sealing portion on the wiring patterns and insulating film such that a part of each of the wiring patterns positioned on the upper side of the first face is exposed;

(7) forming a plurality of external terminals over the wiring patterns in a region including the upper side of the extension portion and connecting the external terminals to the wiring patterns; and (8) forming individual semiconductor devices comprising the semiconductor chip by cutting along a cutting line which passes through the construction for aiding singularization.

The manufacturing method of the semiconductor device also comprises the steps of:

(1) setting a plurality of semiconductor chip disposal regions on which a plurality of semiconductor chips is to be disposed at predetermined intervals on a base comprising a first surface and a second surface which opposes the first surface, and forming a construction for aiding singularization so as to surround the semiconductor chip disposal regions;

(2) providing a semiconductor chip having a first main surface on which a plurality of electrode pads is provided, a second main surface which opposes the first main surface, and a plurality of side surfaces positioned between the first main surface and second main surface on the semiconductor chip disposal region such that the second main surface faces the semiconductor chip disposal region;

(3) forming an extension portion having a first face and a second face which opposes the first face on the base so as to contact the side surfaces of the semiconductor chip and thereby surround the semiconductor chip, and such that the level of the first face is substantially equal to the level of the first main surface;

(4) forming an insulating film on the first face of the extension portion and the first main surface such that a part of each of the electrode pads is exposed;

(5) forming a plurality of wiring patterns on the insulating film so as to be electrically connected to the electrode pads, respectively and extended from the electrode pads to the upper side of the first face of the extension portion;

(6) forming a plurality of electrode posts on each of the part of the wiring patterns positioned on the upper side of the extension portion;

(7) forming a sealing portion over the wiring patterns and insulating film such that the top surface of the electrode posts is exposed;

(8) forming external terminals on the top surface of the exposed electrode posts; and (9) forming individual semiconductor devices comprising the semiconductor chip by cutting along a cutting line which passes through the construction for aiding singularization.

The manufacturing method of the semiconductor device further comprises the steps of:

(1) setting a plurality of semiconductor chip disposal regions on which a plurality of semiconductor chips is to be disposed at predetermined intervals on a base comprising a first surface and a second surface which opposes the first surface, and forming a construction for aiding singularization so as to surround the semiconductor chip disposal regions;

(2) forming an extension portion in a region other than the semiconductor chip disposal region on the first surface;

(3) providing a semiconductor chip having a first main surface on which a plurality of electrode pads are provided, a second main surface which opposes the first main surface, and a plurality of side surfaces positioned between the first main surface and second main surface on the semiconductor chip disposal region such that the second main surface faces the semiconductor chip disposal region;

(4) forming an insulating film on the first face of the extension portion and the first main surface such that a part of each of the electrode pads is exposed;

(5) forming wiring patterns extended from the electrode pads to a region including the upper side of the extension portion;

(6) forming a sealing portion on the insulating film on which the wiring patterns are formed such that a part of each of the wiring patterns positioned on the extension portion is exposed;

(7) forming a plurality of external terminals over the wiring patterns in a region including the upper side of the extension portion and connecting the external terminals to the wiring patterns; and (8) forming individual semiconductor devices comprising the semiconductor chip by cutting along a cutting line which passes through the construction for aiding singularization.

The manufacturing method of the semiconductor device further comprises the steps of:

(1) setting a plurality of semiconductor chip disposal regions on which a plurality of semiconductor chips is to be disposed at predetermined intervals on a base comprising a first surface and a second surface which opposes the first surface, and forming a construction for aiding singularization so as to surround the semiconductor chip disposal regions;

(2) forming an extension portion in a region other than the semiconductor chip disposal region on the first surface;

(3) providing a semiconductor chip having a first main surface on which a plurality of electrode pads are provided, a second main surface which opposes the first main surface, and a plurality of side surfaces positioned between the first main surface and second main surface on the semiconductor chip disposal region such that the second main surface faces the semiconductor chip disposal region;

(4) forming an insulating film on the surface of the extension portion and the first main surface such that the electrode pads are exposed;

(5) forming wiring patterns extended from the electrode pads to a region including the upper side of the extension portion;

(6) forming a plurality of electrode posts on each of the part of the wiring patterns on the extension portion;

(7) forming a sealing portion on the wiring patterns and electrode posts such that the top surface of the electrode posts is exposed;

(8) forming external terminals on the top surface of the exposed electrode posts; and (9) forming individual semiconductor devices comprising the semiconductor chip by cutting along a cutting line which passes through the construction for aiding singularization.

Here, the step (2) is a step for covering the regions other than the semiconductor chip disposal regions on the first surface with an extension portion material, and a step of forming the extension portion by curing this extension portion material is preferably comprised between the steps (3) and (4).

The manufacturing method of the semiconductor device further comprises the steps of:

(1) setting a plurality of semiconductor chip disposal regions on which a plurality of semiconductor chips is to be disposed at predetermined intervals on a base comprising a first surface and a second surface which opposes the first surface, and forming a construction for aiding singularization so as to surround the semiconductor chip disposal regions;

(2) providing material for the extension portion on the semiconductor chip disposal region on the first surface so as to include a concave portion;

(3) providing a semiconductor chip having a first main surface on which a plurality of electrode pads are provided, a second main surface which opposes the first main surface, and a plurality of side surfaces positioned between the first main surface and second main surface within the concave portion such that the second main surface faces the semiconductor chip disposal region;

(4) curing the material for the extension portion to form the extension portion;

(5) forming an insulating film on the surface of the extension portion and the first main surface such that the electrode pads are exposed;

(6) forming wiring patterns extended from the electrode pads to a region including the upper side of the extension portion;

(7) forming a sealing portion on the insulating film on which the wiring patterns are formed such that a part of each of the wiring patterns positioned on the extension portion is exposed;

(8) forming a plurality of external terminals over the wiring patterns in a region including the upper side of the extension portion and connecting the external terminals to the wiring patterns; and (9) forming individual semiconductor devices having the semiconductor chip by cutting along a cutting line which passes through the construction for aiding singularization.

The manufacturing method of the semiconductor device further comprises the steps of:

(1) setting a plurality of semiconductor chip disposal regions on which a plurality of semiconductor chips is to be disposed at predetermined intervals on a base comprising a first surface and a second surface which opposes the first surface, and forming a construction for aiding singularization so as to surround the semiconductor chip disposal regions;

(2) providing material for the extension portion on the semiconductor chip disposal region on the base so as to comprise a concave portion;

(3) providing a semiconductor chip having a first main surface on which a plurality of electrode pads are provided, a second main surface which opposes the first main surface, and a plurality of side surfaces positioned between the first main surface and second main surface in the concave portion such that the second main surface faces the semiconductor chip disposal region;

(4) curing the material for the extension portion to form the extension portion;

(5) forming an insulating film on the surface of the extension portion and the first main surface such that the electrode pads are exposed;

(6) forming wiring patterns extended from the electrode pads to a region including the upper side of the extension portion;

(7) forming a plurality of electrode posts on each of the part of the wiring patterns on the extension portion;

(8) forming a sealing portion on the wiring patterns and electrode posts such that the top surface of the electrode posts is exposed;

(9) forming external terminals on the top surface of the exposed electrode posts; and

(10) forming individual semiconductor devices comprising the semiconductor chip by cutting along a cutting line which passes through the construction for aiding singularization.

Wherein, the construction for aiding singularization is preferably formed as a groove, and the cutting line is preferably formed as a cutting line which passes through the groove.

Alternatively, the construction for aiding singularization is preferably formed as a plurality of through holes from the first surface through to the second surface, and the cutting line is preferably formed as a cutting line which passes through the plurality of through holes.

In the manufacturing method for a semiconductor device, a step of further forming position alignment marks on a region of the base other than the semiconductor chip disposal region such that the plurality of semiconductor chips is disposed on the plurality of semiconductor chip disposal regions at predetermined intervals is preferably a step of disposing the plurality of semiconductor chips at predetermined intervals while gradually adjusting the disposal positions of the semiconductor chips using the coordinates of the position alignment marks as a reference.

In the manufacturing method for a semiconductor device, a step of forming the position alignment marks as through holes to form individual semiconductor devices including a semiconductor chip is preferably a step of cutting along the cutting line while gradually adjusting the cutting position using the coordinates of the position alignment marks as a reference.

In the manufacturing method for a semiconductor device, a step of further forming position alignment marks in a region on the second surface side which opposes a region on the base other than the semiconductor chip disposal region to thereby form individual semiconductor devices including a semiconductor chip is preferably a step of cutting along the cutting line while gradually adjusting the cutting position using the coordinates of the further position alignment marks as a reference.

According to this manufacturing method for the semiconductor device of this invention, a semiconductor device with increased functional sophistication, number of functions, and compactness can be provided by means of a comparatively easy process. In particular, design freedom in the disposal pitch, disposal positions, and so on of the external electrodes can be greatly increased.

Further, the construction for aiding singularization is formed on the base from one, two, or more groove portions or a plurality of through holes, for example, and thus the singularization process of the semiconductor device can be performed extremely easily.

Particularly when the base is formed from a metallic material, for example, in consideration of thermal conductivity and thermal radiation, the amount of burrs (shavings) of the metallic material, which are inevitably produced during implementation of the singularization process, can be reduced. Accordingly, electrical short circuits caused when the burrs of the metallic material become attached between circuits on the mounting substrate or between terminals on electronic components, and defects such as malfunctions caused by these short circuits can be reduced greatly. Irregularities in the outer form of the manufactured semiconductor devices can also be reduced.

Further, from among the cutting devices used in the singularization process, wear in a blade which cuts the base while in contact therewith can be further reduced, and thus the effect of a further reduction in the manufacturing costs of the semiconductor device can be expected.

In addition, by forming position alignment marks on the base, formation of the construction for aiding singularization, disposal of the semiconductor chip on the base, and singularization can be performed while adjusting position with a high degree of precision on the basis of the coordinates of the position alignment marks.

BRIEF DESCRIPTION OF THE DRAWINGS

The foregoings and other objects, features and advantageous of the present invention will be better understood from the following description taken in connection with the accompanying drawings, in which.

Figure 12A:
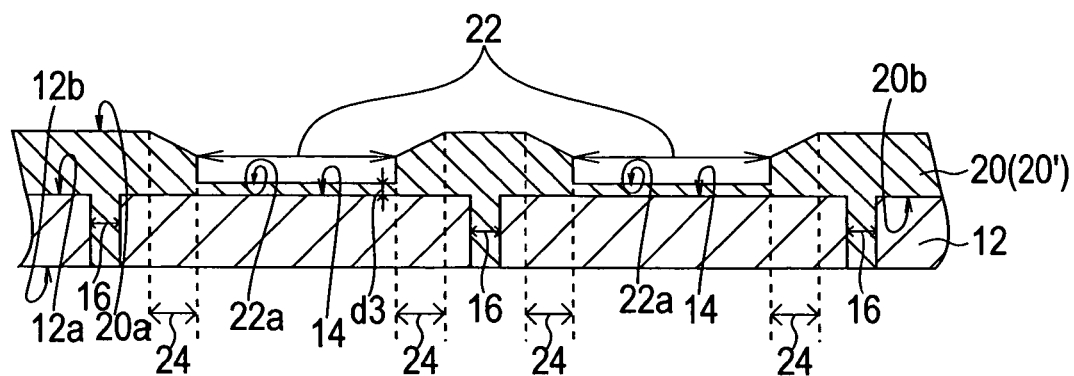
Figure 12B:
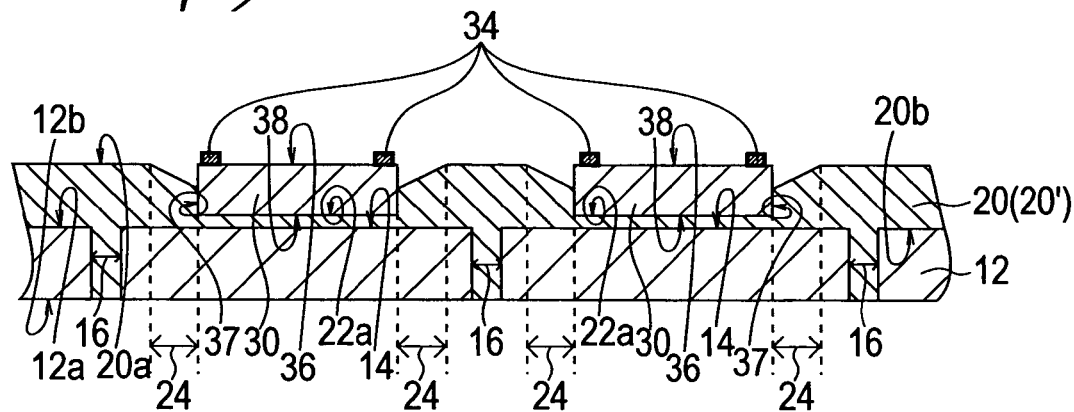
Figure 12C:
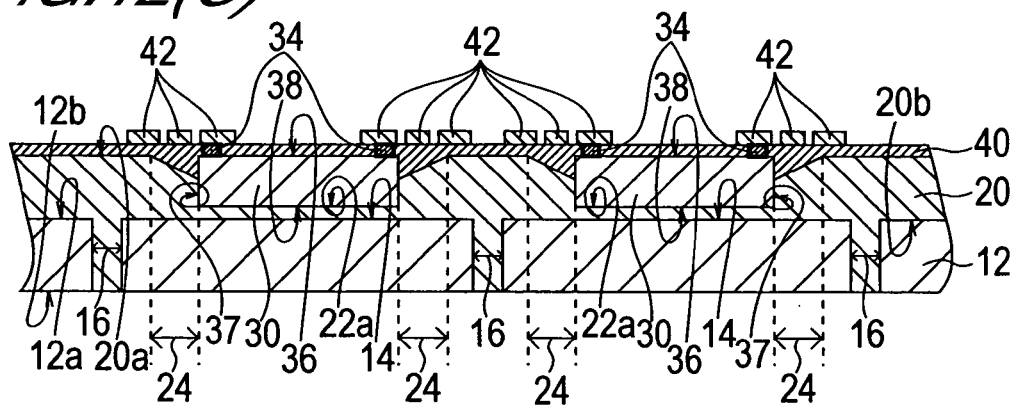
Figure 13A:
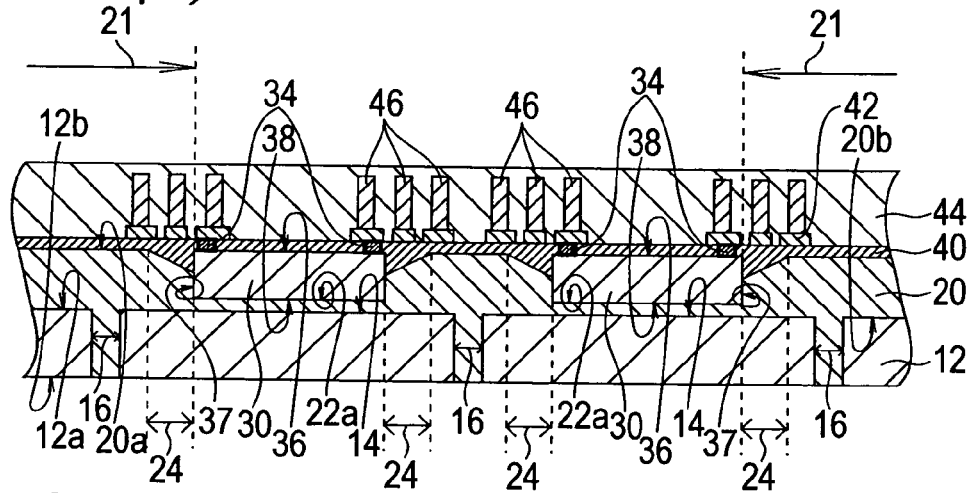
Figure 13B:
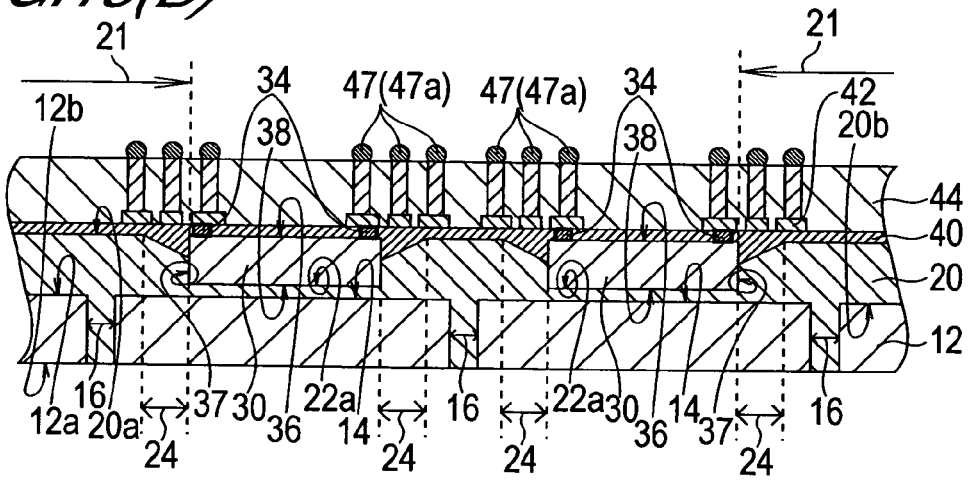
Figure 13C:
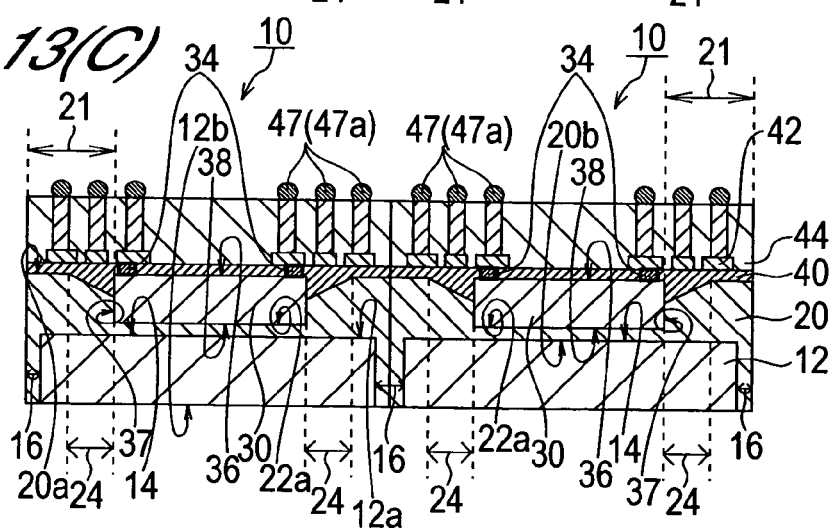

FIGS. 12(A), 12(B), and 12(C) are schematic sectional views for illustrating a second manufacturing method of the semiconductor device of this invention; and FIGS. 13(A), 13(B), and 13(C) are schematic sectional views subsequent to FIG. 12 for illustrating the second manufacturing method of the semiconductor device of this invention.

DESCRIPTION OF THE PREFERRED EMBODIMENTS

Embodiments of this invention will be described below with reference to the drawings. Note that in the drawings, the form, magnitude, and positional relationships of each constitutional component are merely illustrated schematically in order to facilitate understanding of this invention and no particular limitations are placed on this invention thereby. Further, although specific materials, conditions, numerical value conditions, and so on are used in the following description, these are merely one preferred example thereof and therefore do not place any limitations on this invention. It is to be understood that similar constitutional components in the drawings used in the following description are allocated and illustrated with identical reference symbols, and that duplicate description thereof has occasionally been omitted.

Figure 1A:
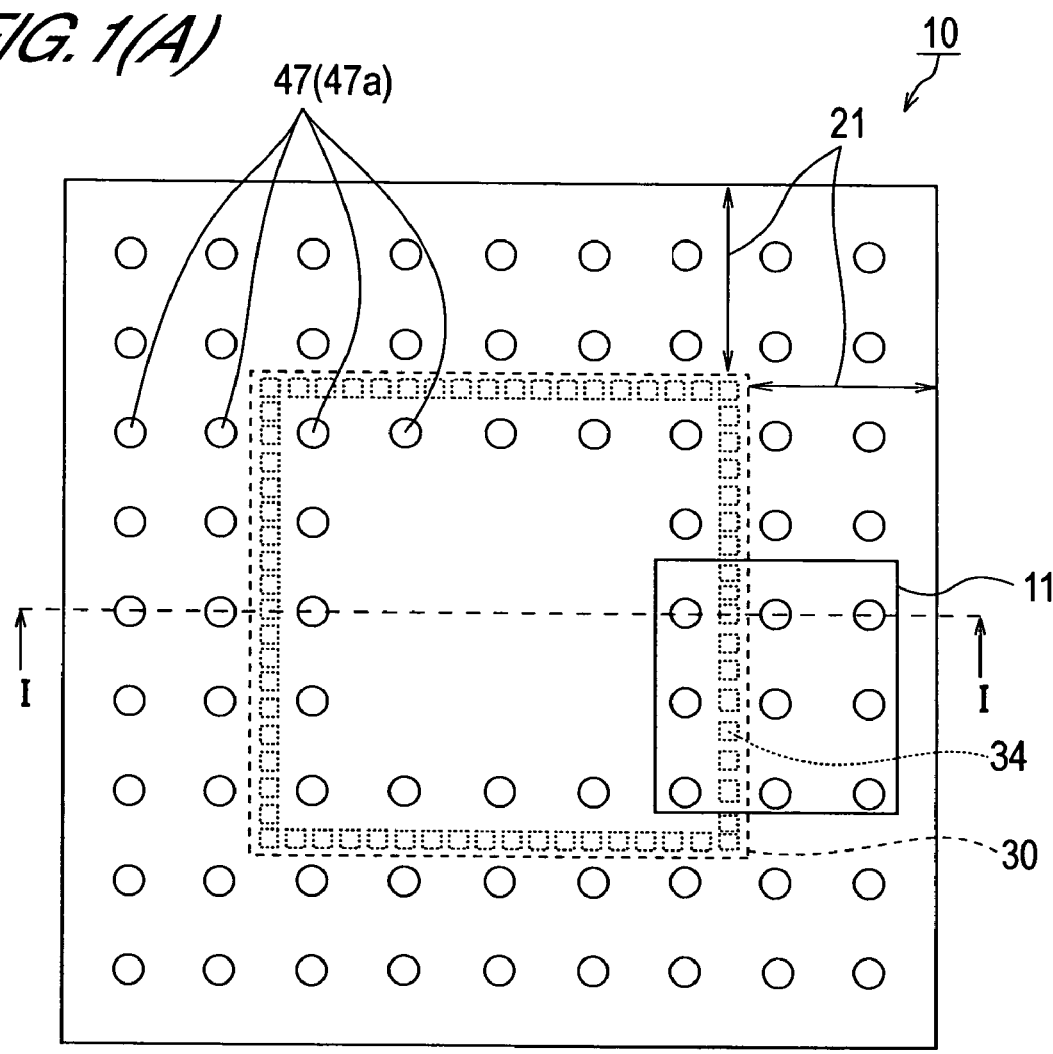
FIG. 1(A) is a plan view seen from above showing in outline a constitutional example of a semiconductor device of this invention.
Figure 1B:
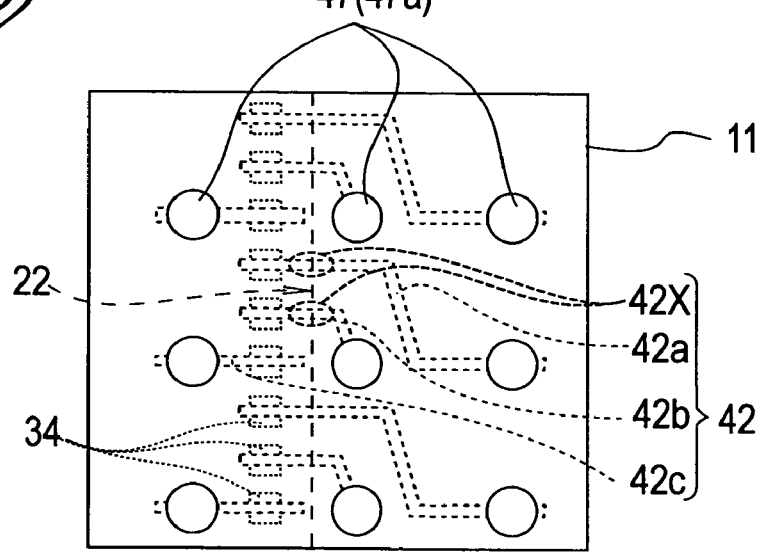
FIG. 1(B) is a plan view showing an expanded outline of the main parts of one region of FIG. 1(A) in order to illustrate the connection relationship between a wiring pattern and electrode pads.

A constitutional example of a semiconductor device of this invention will be described with reference to FIGS. 1 and 2. FIG. 1(A) is a plan view seen from above illustrating a constitutional example of the semiconductor device, and FIG. 1(B) is a plan view showing an expanded outline of the main parts of the region of FIG. 1(A) which is surrounded by a solid line 11 in order to illustrate the connection relationship between a wiring pattern and electrode posts. FIGS. 2(A), 2(B), 2(C), and 2(D) are schematic sectional views showing cross sections of four constitutional examples respectively severed along a broken line I—I in FIG. 1(A).

A semiconductor device 10 of this invention comprises a semiconductor chip 30 on a base 12.

The base 12 is preferably formed from a plate-form or sheet-form body appropriately selected from a ceramic substrate, a metallic substrate, an Si substrate, or similar. Regarding the material for the base 12, a material having a greater thermal conductivity than an extension portion 20 to be described below is preferably selected in consideration of thermal conductivity and thermal radiation. A material having a thermal conductivity of approximately 0.7 is envisaged as being applied to the extension portion 20 to be described below, and therefore 42 Alloy (an iron/nickel alloy: thermal conductivity 12.5 W/m·K) or nickel (Ni: thermal conductivity 88 W/m·K), for example, may be selected as the material for the base 12. It is preferable that a material having a thermal conductivity of at least 150 W/m·K be selected. More specifically, it is preferable that a metallic material selected from a group including, for example, copper (Cu: thermal conductivity 394 W/m·K), aluminum (Al: thermal conductivity 229 W/m·K), and a copper/tungsten alloy (CuW: thermal conductivity 210 W/m·K), or a ceramic material selected from a group including silicon carbide (SiC: thermal conductivity 260 W/m·K) and aluminum nitride (AlN: thermal conductivity 70 to 170 W/m·K) be selected.

The base 12 comprises a first surface 12a and a second surface 12b which opposes the first surface 12a.

Particularly when the base 12 is formed from copper (Cu), a thin oxidation film is preferably formed at least on the first surface 12a to improve the adhesiveness with the extension portion 20 to be formed at a later stage.

The base 12 preferably has a three-dimensional constitution in which the surface area of the second surface 12b, which is the surface which contacts the atmosphere (including the atmosphere around the semiconductor device, as below), is enlarged to within a range that does not adversely affect the subsequent manufacturing process (not shown in the drawing). The second surface 12b may be formed in the shape of a well-known so-called heat sink in order to increase the thermal radiation effect. More specifically, the base 12 may be formed such that a plurality of cylindrical protrusions protrude from the second surface 12b in lattice form, for example, or such that a plurality of wing-shaped plate-form bodies protrude therefrom at predetermined intervals.

The semiconductor chip 30 comprises a first main surface 36, a second main surface 38 which opposes the first main surface 36, and one, two, or more side surfaces 37 positioned between the first main surface 36 and second main surface 38. The semiconductor chip 30 further comprises a circuit element having a predetermined function and a plurality of electrode pads 34 electrically connected to the circuit element. The plurality of electrode pads 34 is provided on the first main surface 36. The plurality of electrode pads 34 is formed around the peripheral edge of the first main surface 36.

Figure 2A:
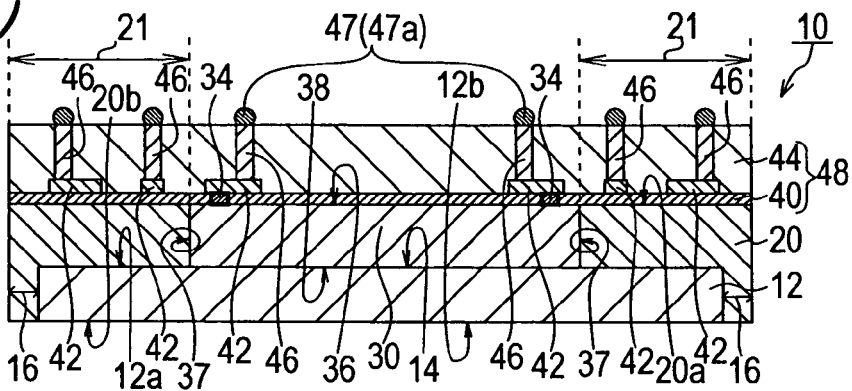
FIGS. 2(A), 2(B), 2(C), and 2(D) are schematic sectional views showing cross sections of the semiconductor device of FIG. 1(A) severed along a broken line I—I.
Figure 2B:
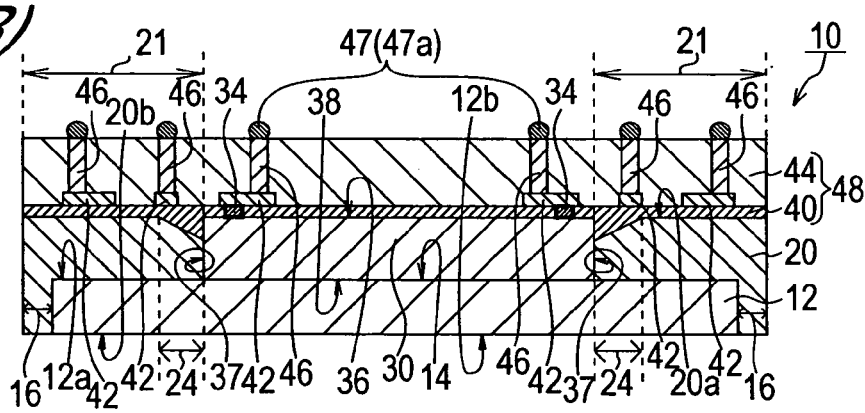

The semiconductor chip 30 is provided on the base 12 such that the first main surface 36 becomes the upper face, or in other words such that the second main surface 38 faces a semiconductor chip disposal region 14 (FIGS. 2(A) and 2(B)).

The semiconductor device 10 of this invention comprises an extension portion 20 on the base 12. This extension portion 20 is formed such that the level (i.e. height, as below) of a first face 20a thereof is substantially equal to the level of the first main surface 36 of the semiconductor chip 30.

FIG. 2(B) is a modified example of FIG. 2(A), and shows a constitutional example comprising inclined inside walls 24 formed such that the extension portion 20 becomes gradually thinner toward the semiconductor chip 30 side. FIG. 2(D) is a modified example of FIG. 2(C), and shows a constitutional example comprising the inclined inside walls 24 formed such that the extension portion 20 becomes gradually thinner toward the semiconductor chip 30 side.

In the constitutional examples of FIGS. 2(A) and (B), the extension portion 20 is provided such that the semiconductor chip disposal region 14 is exposed.

Figure 2C:
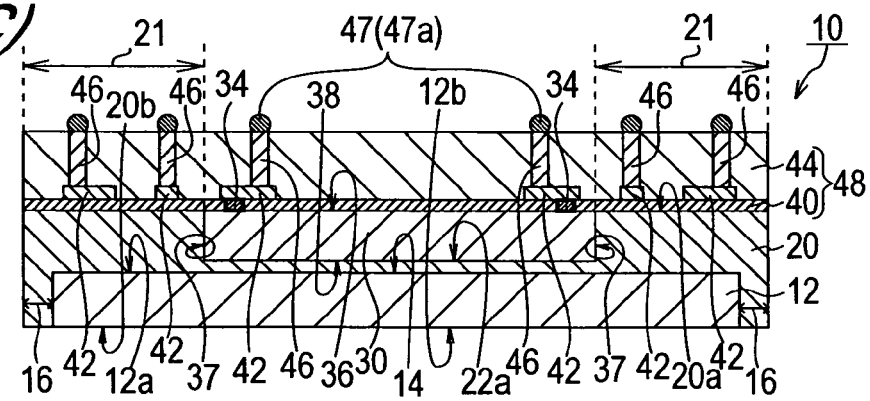
Figure 2D:
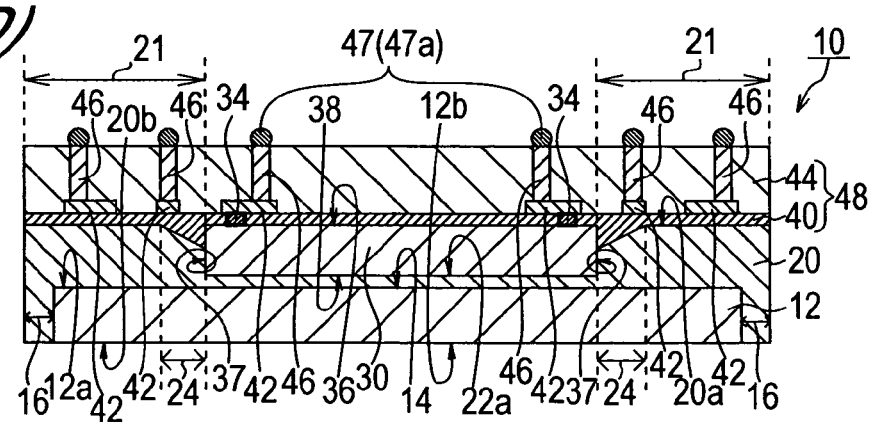

In the constitutional examples of FIGS. 2(C) and (D), the extension portion 20 covers the semiconductor element disposal region 14 of the base 12 and defines a concave portion 22a. In the constitutional examples of FIGS. 2(C) and (D), the extension portion 20 comprises a concave portion 22 for providing the semiconductor chip 30. The concave portion 22 comprises a bottom face portion 22a which matches the profile of the semiconductor chip disposal region 14.

The semiconductor chip 30 is provided on the semiconductor chip disposal region 14 or in the concave portion 22.

The semiconductor chip 30 is provided such that the first main surface 36 becomes the upper face, or in other words such that the second main surface 38 faces the semiconductor chip disposal region 14 or the bottom face portion 22a of the concave portion 22 in the extension portion 20.

As a result, in the constitution shown in FIGS. 2(A) and (B), the extension portion 20 is provided surrounding the side surfaces 37 of the semiconductor chip 30. In the constitution in FIGS. 2(C) and (D), the extension portion 20 is provided surrounding the faces of the semiconductor chip 30 other than the first main surface 36, or in other words the side surfaces 37 and second main surface 38.

The extension portion 20 may be appropriately selected from an organic material such as epoxy resin or silicone resin, for example. That is, a so-called liquid resin or mold resin may be applied.

In order to prevent warping of the semiconductor device 10 of this invention during the manufacturing process, the extension portion 20 is preferably formed from a material having a larger molding shrinkage than the molding shrinkage of a subsequently formed sealing portion.

Here, "molding shrinkage" indicates shrinkage of a single material occurring during a molding process. In other words, "molding shrinkage" corresponds to the sum of curing shrinkage at molding temperature and thermal contraction occurring during the return from molding temperature to normal temperature.

More specifically, the extension portion 20 is preferably formed from a liquid resin having a coefficient of linear expansion within a lower temperature range than glass transition point of less than $1.5 \times 10^{-5}/^\circ$ C. and a modulus of elasticity within a range of 7.8 to 22 GPa. A case in which mold resin is applied to the extension portion 20 will be described hereinafter.

An insulating film 40 is formed on the first face 20a of the extension portion 20 and the first main surface 36 such that the plurality of a part of each of electrode pads 34 is exposed.

A plurality of wiring patterns 42 is formed on the surface of the insulating film 40 so as to be electrically connected to the exposed electrode pads 34.

A sealing portion 44 is provided on the respective surface regions of the semiconductor chip 30 and extension portion 20 so as to cover the wiring patterns 42 and insulating film 40. The insulating film 40 and sealing portion 44 described above are also referred to collectively as an insulating layer 48. Electrode posts 46 are provided so as to pass from each of the wiring patterns 42 through the sealing portion 44 to reach the surface of the sealing portion 44. Apart of the electrode posts 46 is provided on the upper side of (directly above) the semiconductor chip 30, and the remaining electrode posts 46 are provided on the upper side of (directly above) the extension portion 20. These electrode posts 46 are normally arranged at a constant pitch. The top surface of each electrode post 46 is exposed on the surface of the sealing portion 44. The electrode posts 46 are also referred to as post electrodes, and external terminals 47 are provided on the exposed top surface thereof. Solder balls 47a are usually provided as the external terminals 47. These external terminals 47 are provided at a wider pitch than the arrangement pitch of the electrode pads 34.

Here, using FIG. 1(B), the connection relationships between the electrode pads 34 and wiring patterns 42 will be described. A partial region (the region surrounded by the solid line) 11 of FIG. 1(A) has been expanded and illustrated in order to facilitate understanding of these connection relationships. The wiring patterns 42 are constituted such that each of the electrode posts (shown as 46 in FIG. 2) connected to the lower portion of the external terminals 47 is regularly and electrically connected to a corresponding electrode pad 34. A long wire 42a, a medium wire 42b, and a short wire 42c, for example, are provided as the wires which constitute each wiring pattern 42. These wires 42a, 42b, and 42c are respectively connected in that order to the corresponding electrode pad 34 in a one-on-one connection relationship of one wire to one electrode pad.

The wiring patterns 42 are provided in a region on the upper side of (directly above) the semiconductor chip 30 and on the upper side of (directly above) the extension portion 20, or in other words so as to straddle the boundary of an extended region 21. More specifically, at least a part of the plurality of wiring patterns 42 is individually electrically connected to each of the electrode pads 34 such that the electrode pads 34 are extended from the upper side of the first main surface to the upper side of the first face 20a of the extension portion 20.

Hence a portion 42X of the wiring patterns 42 having a certain length on or in the vicinity of this boundary is preferably comprised of thicker and/or wider wire.

By forming the portion 42X of the patterns 42 at which stress is considered more likely, due to such phenomena as thermal stress and particularly an edge effect, to be thicker in this manner, operational reliability in the semiconductor device 10 is improved.

In other word, a portion 42X of said wiring patterns on a boundary and vicinity thereof between a region on the upper side of said semiconductor chip and a region of said extension portion is formed wider or more thickly than other portions of said wiring patterns.

The region on the upper side of (directly above) the extension portion 20 is referred to as the extended region 21 due to the fact that the external terminal forming region extends beyond the surface region of the semiconductor element. In this constitutional example, electrode posts 46 are also formed on the extended region 21.

The sealing portion 44 is formed so as to cover the wiring patterns 42 and electrode posts 46. The sealing portion 44 is formed such that a part of the electrode posts 46 is exposed.

The external terminals 47 are formed via the electrode posts 46. A constitution is also possible in which the external terminals are directly connected to the wiring patterns 42 without passing through the electrode posts by exposing a part of the wiring patterns 42 through the sealing portion 44.

In this constitutional example, the external terminals 47 are formed from solder balls 47a, for example. These solder balls 47a are provided on the top surface of the exposed electrode posts 46 and connected to the wiring patterns 42 via the electrode posts 46. The arrangement and pitch of adjacent electrode posts 46 may be set as desired in consideration of mounting onto a printed board or the like, for example.

Note that a region indicated by the reference symbol 16 in each of the drawings of FIG. 2 is a construction used to aid singularization performed during the manufacturing process to be described below. This construction will be described below.

As described above, the electrode posts 46 are provided not only within a surface area range corresponding to the upper side of the semiconductor chip 30, but also on the upper side of the extension portion 20, or in other words on the extended region 21. As a result, design freedom in the disposal positions and disposal pitch of the electrode posts 46 is increased. In other words, restrictions on the disposal pitch of the external terminals 47 are eased such that mounting is facilitated, and thus the electrode posts 46 can be formed at a wider pitch and in a desired number in accordance with the constitutional requirements on the mounting substrate side, for example. More specifically, external terminals can be formed at a desired disposal pitch and in a desired number by appropriately adjusting the surface area of the formed extension portion 20.

According to the constitution of the semiconductor device 10 of this invention, the external terminals 47 are provided on the side surfaces 37 of the semiconductor chip 30, or in other words on the upper side of (directly above) the extension portion 20, that is the extended region 21, which is provided in contact with and so as to surround the faces of the semiconductor chip 30 other than the first main surface 36 and second main surface 38. Thus the semiconductor device 10 can be constituted in a so-called fan-out constitution or a fan-in/fan-out constitution in which the external terminals 47 are also formed on the upper side of the first main surface 36. As a result, design freedom in the disposal pitch, disposal positions, and soon of the external terminals 47 can be increased.

Further, the base 12 is formed from a material selected in consideration of thermal conductivity and thermal radiation properties, and is formed in a three-dimensional constitution in which the surface area of the second surface 12b is enlarged in order to increase the thermal radiation effect. Thus defects such as malfunctions caused by the heat of the semiconductor device 10 can be prevented.

The semiconductor device 10 of this invention is constituted using a so-called WCSP manufacturing process such that the semiconductor chip 30 and external electrodes 47 are directly connected without the use of an interposer such as a substrate, and thus in addition to the aforementioned effect, the operational speed, functional sophistication, number of functions, and compactness of the semiconductor device 10 can be increased in comparison with a device in which a wire bonding connection, for example, is used. The semiconductor device 10 can also be obtained with an identical electrical characteristic to and at a lower cost than a device in which a flip chip connection, for example, is used.

Next, a first manufacturing method for the semiconductor device of this invention will be described with reference to FIGS. 3(A) to 11(C).

Figure 3A:
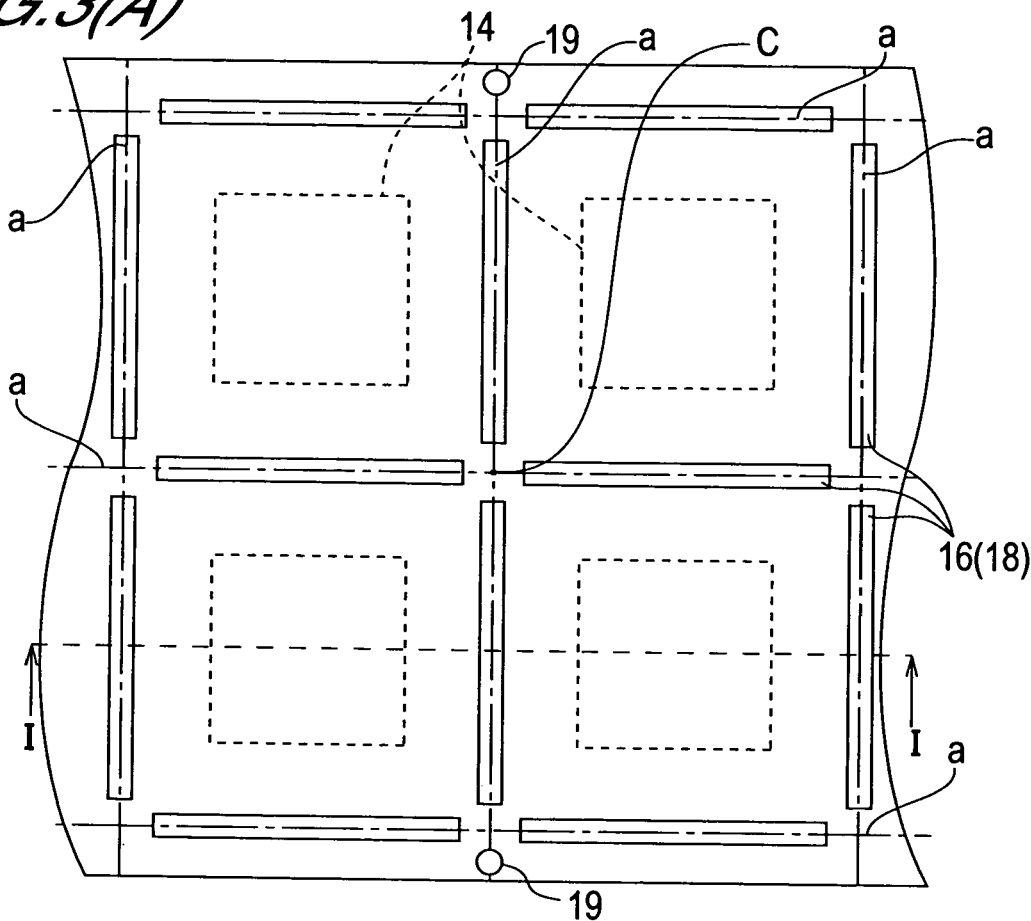
FIGS. 3(A), 3(B), and 3(C) are a schematic plan view seen from above and sectional views for illustrating a constitutional example of a preferred base applied to a first manufacturing method for the semiconductor device of this invention.
Figure 3B:
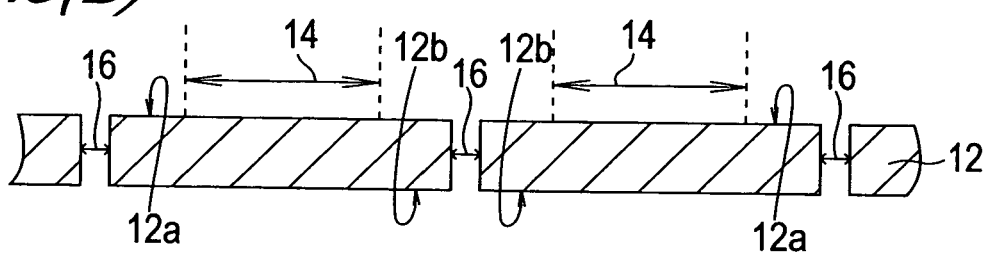
Figure 3C:
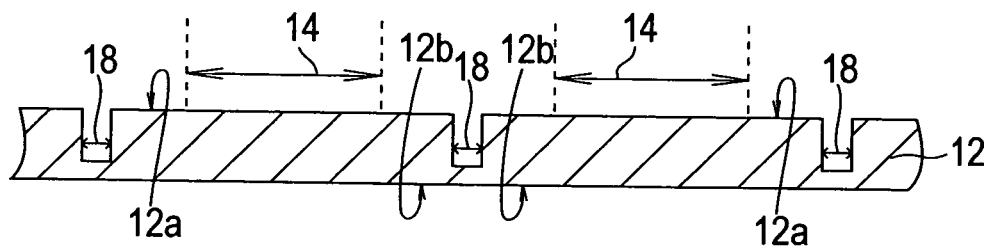

FIG. 3(A) is a schematic plan view seen from above for illustrating a constitutional example of the preferred base 12 applied to the semiconductor device of this invention and the manufacturing method therefor, and FIGS. 3(B) and 3(C) are sectional views showing in outline sections severed along a broken line I—I in FIG. 3(A).

A position alignment mark 19 is formed on the first surface 12a of the base 12. This position alignment mark 19 is formed on the first surface 12a. When used in the disposal process of the semiconductor chip 30 onto the semiconductor chip disposal region 14 to be described below, the position alignment mark 19 may be formed in planar form only on the first surface 12a side, or may be formed with a groove-form or hole-form constitution, for example. When used in the singularization process, the position alignment mark 19 is preferably formed as a through hole from the first surface 12a through to the second surface 12b, for example.

The position alignment mark 19 is formed along the edges of the base 12 on which the semiconductor device 10 is not formed. Here, the position alignment mark 19 is preferably formed symmetrically about a central point C of the base 12.

In the constitutional example shown in FIG. 3(A), the center of four adjacent semiconductor chip disposal regions 14 is presumed to be the central point C of the base 12, and one pair of, or in other words two position alignment marks 19 are formed in the upper and lower directions symmetrically about the central point C. To further improve positioning precision, a plurality of pairs of position alignment marks maybe formed. In this case, the plurality of pairs of position alignment marks 19 are preferably formed such that the pairs are adequately spaced from one another. More specifically, the plurality of pairs of position alignment marks 19 are preferably formed at a spacing such that the plurality of line segments passing through the central point C of the base 12 and connecting the two position alignment marks 19 which form a pair intersect at an angle of approximately 60°, for example.

In consideration of the singularization process, the plurality of pairs of position alignment marks are preferably formed at a spacing such that the plurality of line segments passing through the central point C of the base 12 and connecting the two position alignment marks 19 which form a pair intersect at an angle of approximately 90°, for example.

In consideration of their use in the singularization process, the position alignment marks 19 are preferably formed as through holes from the first surface 12a to the second surface 12b, as described above. A further position alignment mark may be formed separately from the position alignment marks 19 used in the disposal of the semiconductor chip 30 on the semiconductor chip disposal region 14 in a region on the second surface 12b side which opposes a region of the first surface 12a of the base 12 other than the semiconductor chip disposal region. This position alignment mark may be formed in a position which corresponds to the forming position of the position alignment mark 19 formed on the first surface 12a side, or in an independent position which does not correspond thereto. The formation process will be described below.

A construction for aiding the singularization process is formed on the base 12. As shown in FIG. 3(B), for example, this construction may be formed as a plurality of through holes 16 from the first surface 12a of the base 12 to the second surface 12b, or as shown in FIG. 3(C), may be formed as a plurality of groove portions 18 formed from the first surface 12a side of the base 12.

When the construction for aiding the singularization process is formed as the plurality of through holes 16, the respective through holes 16 are formed so as to surround the region on which the semiconductor device 10 is formed. At this time, the formed plurality of through holes 16 are formed at a sufficient spacing from each other such that a region on the base 12 to be described below which corresponds to the manufactured semiconductor device 10 does not drop off during the manufacturing process.

In this constitutional example of this embodiment of the invention, an example is described in which the planar form of the semiconductor device 10 is square, and along each edge constituting the outer periphery of this square, one through hole 16 (in the spaces between two adjacent semiconductor devices 10, one through hole 16 is shared) is formed with a rectangular planar form, transverse section, and vertical section. However, this invention is not limited to this example, and two or more through holes 16 may be formed along each edge (outer periphery) as perforations arranged in linear form in this example. Moreover, the planar form, transverse section, and vertical section of the through holes 16 are not limited to the rectangular form in the example, but may take a circular or other form when preferable and appropriate.

When the construction for aiding singularization is formed as the groove portions 18 as shown in FIG. 3(C), the disposal thereof is not limited to the aforementioned constitutional example shown in FIG. 3(A), and the construction may be constituted as one continuously formed groove portion 18, for example. Further, a constitution is also possible in which a plurality of the groove portions 18 are arranged as perforations as described above. The planar form and sectional forms (transverse section and vertical section) of the through holes 16 are not limited to the rectangular form described above, but may take a circular or other form when preferable and appropriate. The groove portions 18 are formed surrounding the region in which the semiconductor device 10 is formed.

In this constitutional example, an example was described in which the groove portions 18 are formed from the first surface 12a side of the substrate 12, but the groove portions 18 may be formed from the second surface 12b side, for example. Further, although not shown in the drawings, the groove portions 18 may be formed from the first and second surfaces 12a and 12b respectively.

As shown in FIG. 3(A), the through holes 16 and groove portions 18 can be singularized by cutting along a cutting line a shown by the dot/dash line, and hence a plurality of the through holes 16 or one, two, or more of the groove portions 18 are formed so as to pass continuously through the cutting line a.

The width across of the through hole 16 and groove portion 18 in relation to the cutting line a, and the depth of the groove portion 18, are set to a degree at which the singularization process can be performed without hinderance. Approximately 50 to 200 μm, for example, is preferable as the width across.

The through holes 16 and groove portions 18 may be formed using a preferred and appropriate well-known manufacturing process in accordance with the material constituting the base 12. For example, when the base 12 is constituted by a metallic material such as those described above, the formation process of the through holes 16 may be implemented under appropriate conditions using a pressing method, etching, routing, or laser machining. The formation process of the groove portions 18 may be implemented under appropriate conditions using etching, routing, or laser machining. When the base 12 is formed from a ceramic material, for example, the through holes 16 may be formed by pressing performed prior to baking, and the groove portions 18 may be formed by pressing performed prior to baking or scribing performed after baking. The position alignment marks 19 may be formed in a similar manner.

Next, the specific manufacturing processes in an example of the manufacture of the semiconductor device 10 of this invention will be described using FIGS. 4(A) through 11(C).

Figure 8A:
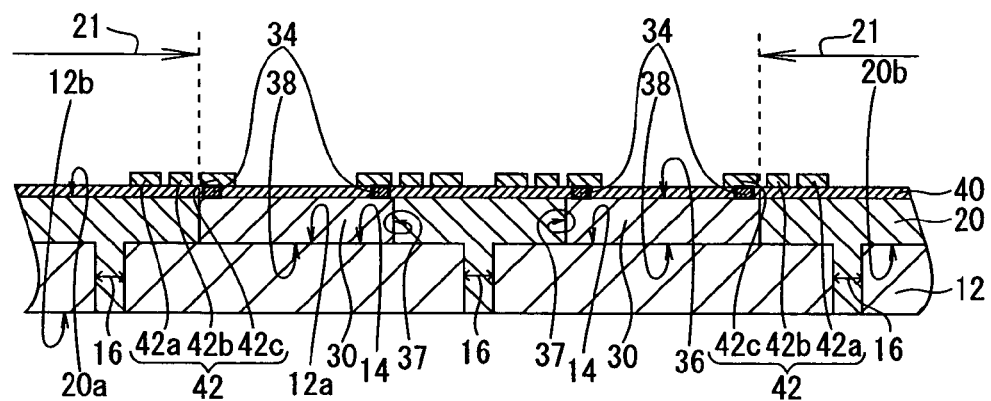
FIG. 8 is a sectional view severed along a broken line I—I in FIG. 7(A)
Figure 8B:
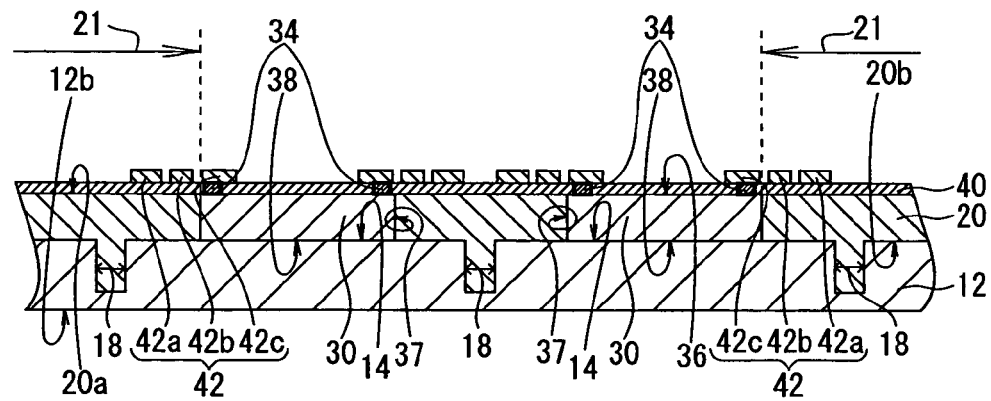

As a rule, each FIG. (A) in FIGS. 4(A) through 11(C) is a partial schematic plan view seen from above for illustrating the constitution of the semiconductor device of this invention, and each FIG. (B) and FIG. (C) is a schematic sectional view showing a cross section severed along a broken line I—I of the corresponding FIG. (A). To facilitate description, FIG. 7(B) is an exception to this rule, being a partial enlarged view of the part of FIG. 7(A) which is surrounded by a solid line 11. Moreover, FIG. 8 is a schematic sectional view severed along the I—I line of FIG. 7(A).

The position alignment marks 19 described above are formed in advance on the base 12. The semiconductor chip disposal region 14 on which the semiconductor chip 30 will be placed is set on the base 12. The profile of the semiconductor chip disposal region 14 substantially matches the profile of the semiconductor chip 30. The intervals between adjacent semiconductor chip disposal regions 14 are set to be equal. This interval is preferably set to a sufficient value in consideration of the surface area of the margin required when the semiconductor devices 10 are divided into individual units in the singularization process to be described below, the surface area of the surface region of the extension portion which is formed in accordance with the desired number of external terminals, and so on.

The through holes 16 (FIG. 3(B)) or groove portions (FIG. 3(C)) serving as the construction for aiding singularization described using FIGS. 3(A) to 3(C) are formed on the basis of the disposal positions of the semiconductor chip disposal regions 14.

Figure 4A:
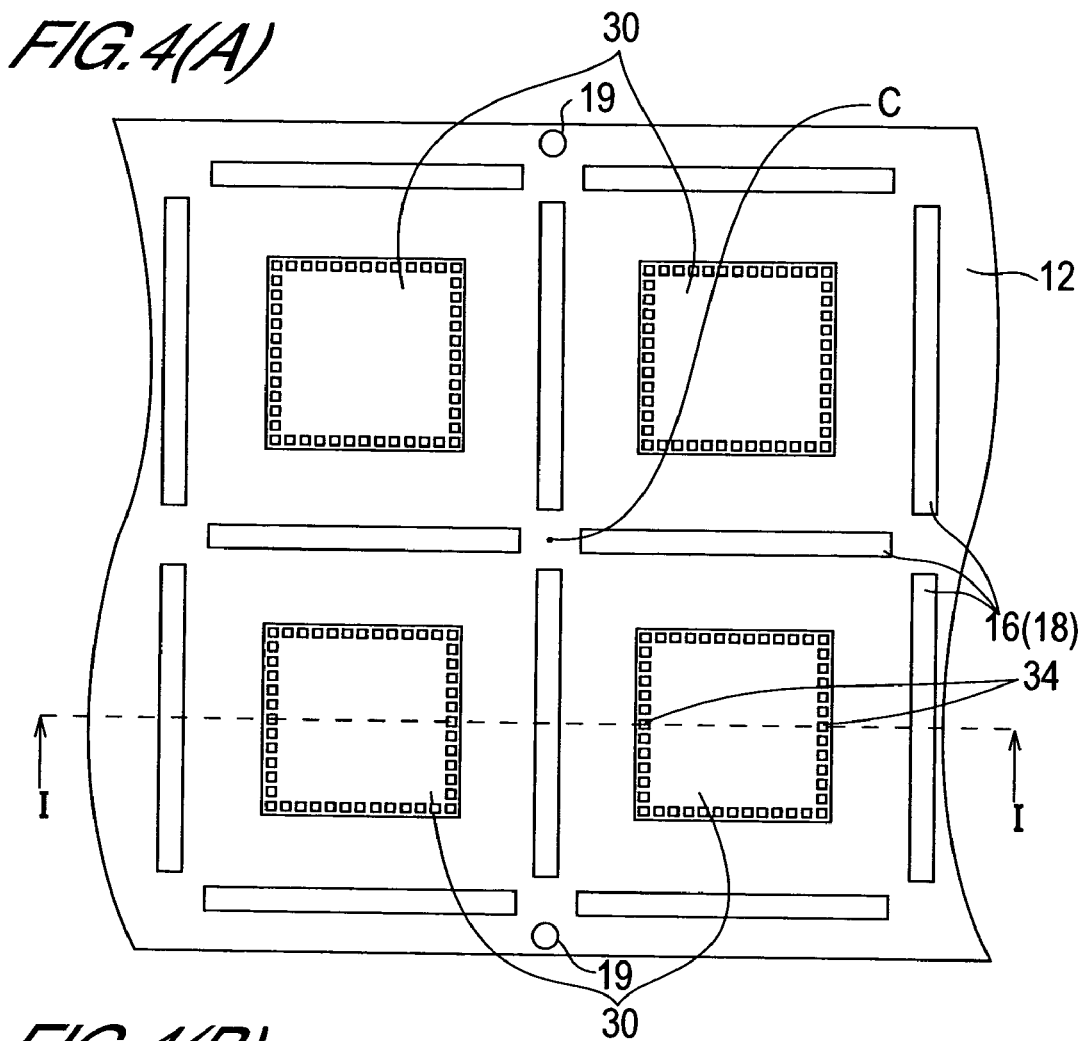
FIGS. 4(A), 4(B), and 4(C) are a schematic plan view seen from above and sectional views for illustrating the first manufacturing method for the semiconductor device of this invention.
Figure 4B:
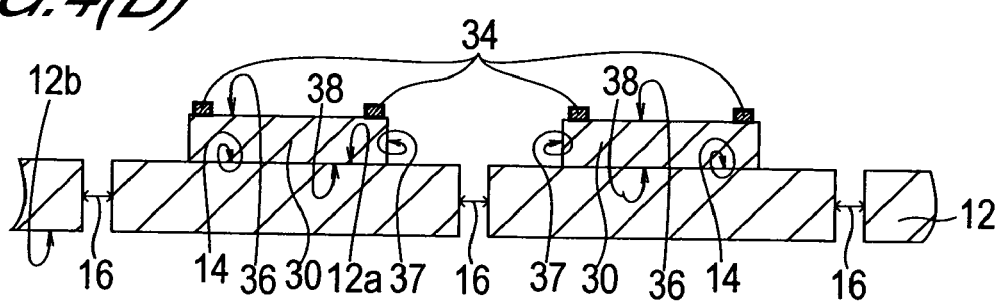
Figure 4C:
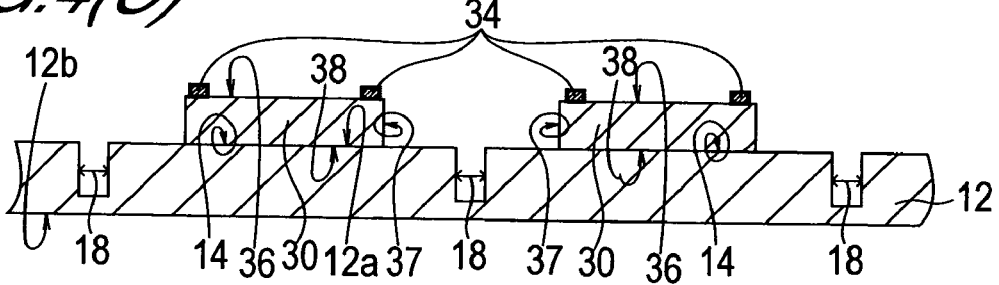

Next, as shown in FIGS. 4(A), 4(B), and 4(C), a plurality of the semiconductor chips 30 is disposed on the set semiconductor chip disposal regions 14 on the base 12 using the coordinates of the position alignment marks 19 as a reference to perform position alignment into appropriate disposal positions. Adhesion means such as an adhesive (not shown) are preferably provided on the first surface 12a of the base 12.

The semiconductor chips 30 are preferably adhered to and held on the semiconductor chip disposal regions 14 by these adhesion means.

As described above, the semiconductor chip 30 comprises a first main surface 36. The first main surface 36 is provided with the electrode pads 34. The electrode pads 34 are provided in a plurality around the peripheral edge of the semiconductor chip 30. The semiconductor chip 30 also comprises the second main surface 38 which opposes the first mains surface 36 and one, two, or more side surfaces 37 positioned between the first main surface and second main surface.

Figure 5A:
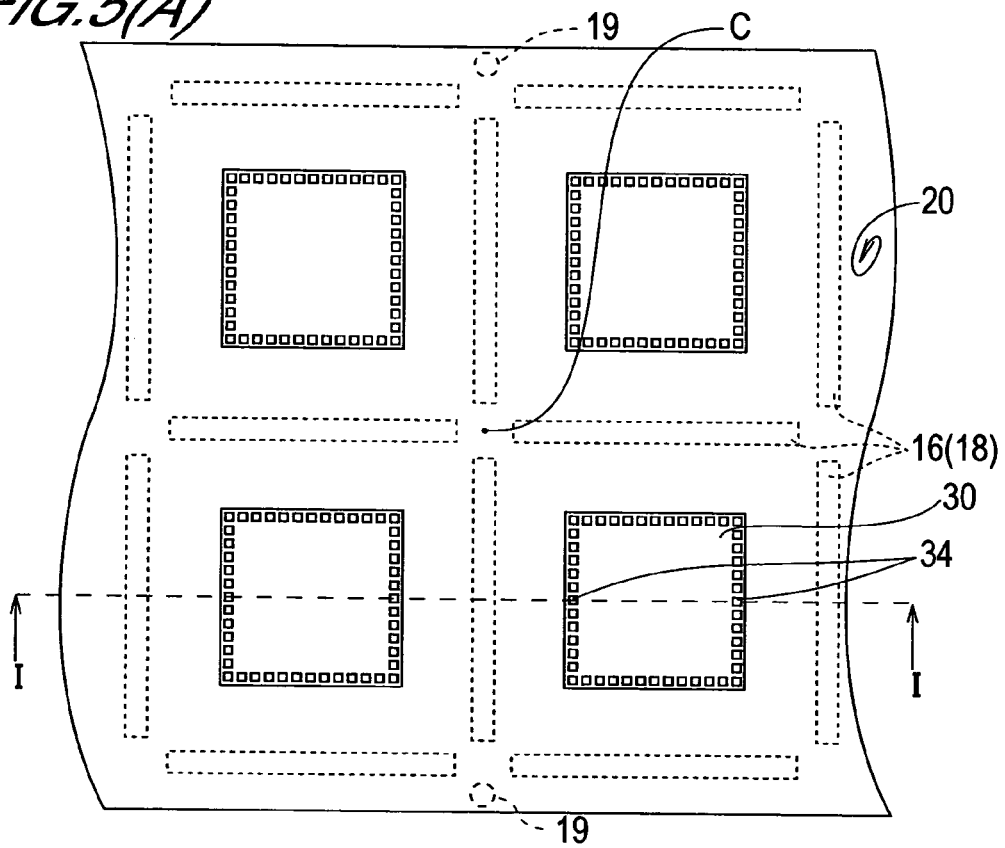
FIGS. 5(A), 5(B), and 5(C) are a schematic plan view seen from above and sectional views subsequent to FIG. 4 for illustrating the first manufacturing method of the semiconductor device of this invention.
Figure 5B:
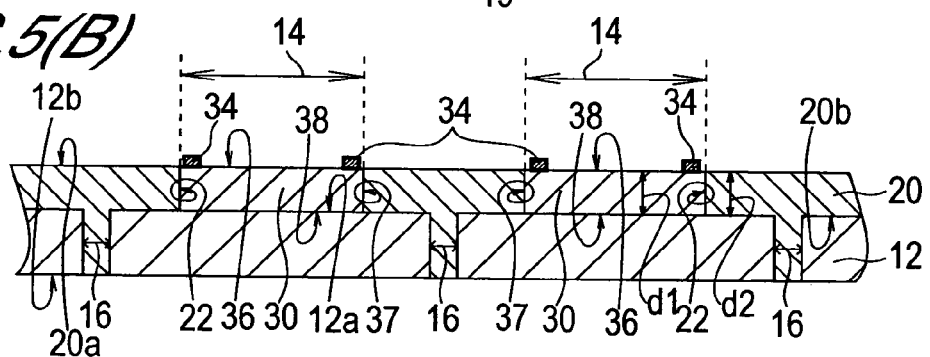
Figure 5C:
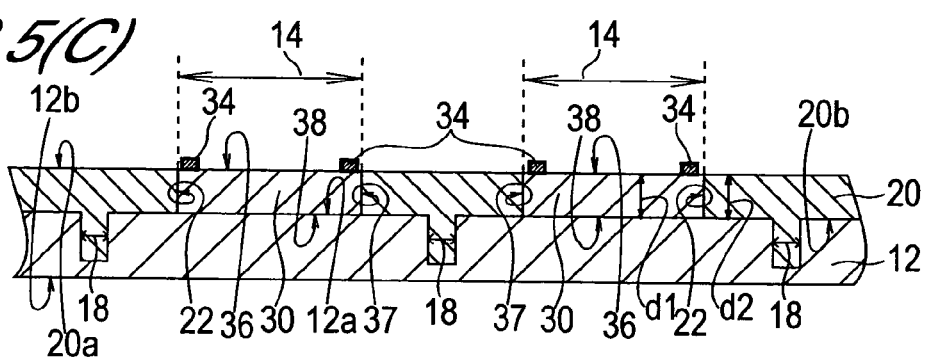

Next, as shown in FIGS. 5(A), 5(B), and 5(C), the extension portion 20 is formed on the side surfaces 37 of the semiconductor chip 30, or in other words in contact with and surrounding the faces of the semiconductor chip 30 other than the first and second main surfaces 36 and 38, so as to fill the gaps between the plurality of semiconductor chips 30. At this time, the through holes 16 or groove portions 18 serving as the construction for aiding singularization formed in the base 12 are also filled with the material for forming the extension portion 20.

As described above, the extension portion 20 maybe applied using a so-called liquid resin or mold resin as the material therefor. This material may be appropriately selected from an organic material such as epoxy resin or silicone resin, for example.

In order to prevent warping of the semiconductor device 10 during the manufacturing process, the extension portion 20 is preferably formed from a material having a larger molding shrinkage than the molding shrinkage of a subsequently formed sealing portion. More specifically, the extension portion 20 is preferably formed using as a material a liquid resin having a coefficient of linear expansion at a lower temperature than glass transition temperature of less than $1.5\times10^{-5}/°$ C., and a modulus of elasticity within a range of 7.8 to 22 GPa.

The following methods (1) to (3), for example, may be applied to the formation of the extension portion 20. (1) and (2) are methods employed when a liquid resin is applied to the extension portion 20, and (3) is a method employed when a mold resin is applied to the extension portion 20.

(1) Liquid resin is supplied by a dispensing method so as to fill the gaps between the plurality of semiconductor chips 30, whereupon the liquid resin is cured using appropriate curing means.

(2) Liquid resin is supplied by a precision printing method so as to fill the gaps between the plurality of semiconductor chips 30, whereupon the liquid resin is cured using appropriate curing means.

(3) The first main surface 36 of the semiconductor chip 30 is set in a die so as to be protected, and mold resin is supplied by a transfer mold method so as to fill the gaps between the plurality of semiconductor chips 30. The mold resin is then cured using appropriate curing means.

Here, the height of the first face 20a of the extension portion 20, that is a thickness d2, and the height of the first main surface 36 of the semiconductor chip 30, that is a thickness d1, preferably match. However, a slight height difference, undulation, or the like may exist as long as this difference is within the range of a difference of elevation at which the subsequently formed wiring patterns may be formed without the danger of the wires becoming disconnected or the like.

Dimensional accuracy in the direction of thickness may be improved particularly when mold resin is applied to the extension portion 20, as a result of which the extension portion 20 may be formed with a higher degree of precision.

Figure 6A:
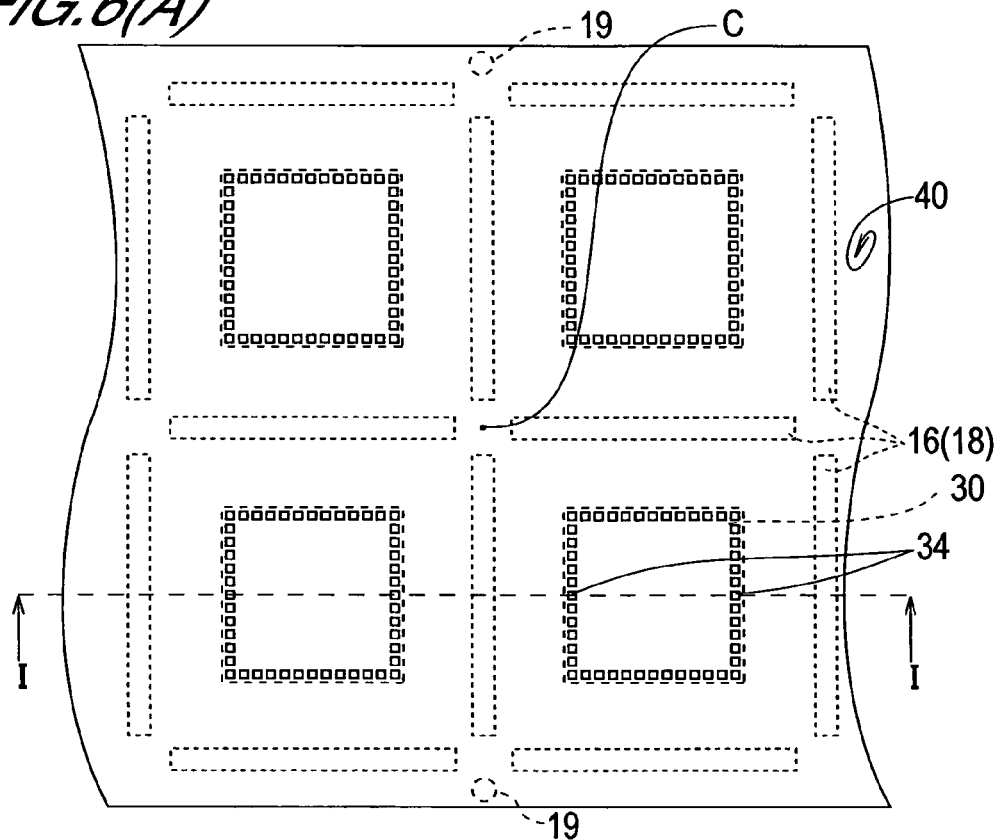
FIGS. 6(A), 6(B), and 6(C) are a schematic plan view seen from above and sectional views subsequent to FIG. 5 for illustrating the first manufacturing method of the semiconductor device of this invention.
Figure 6B:
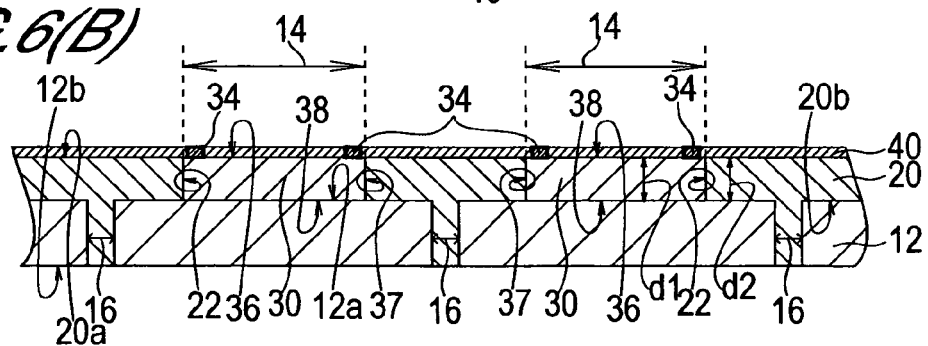
Figure 6C:
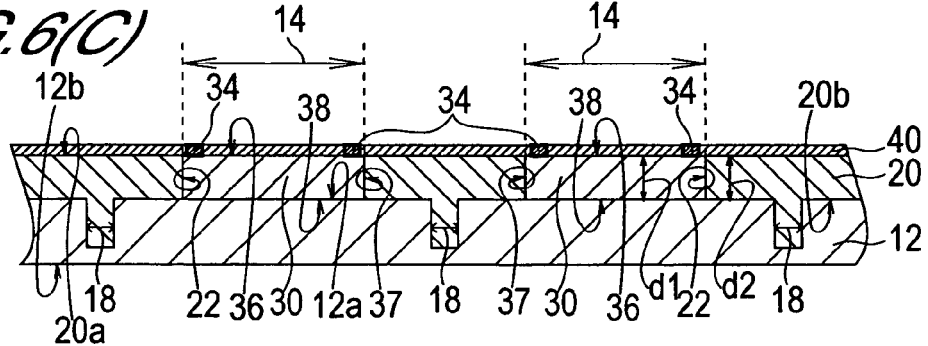
Figure 7A:
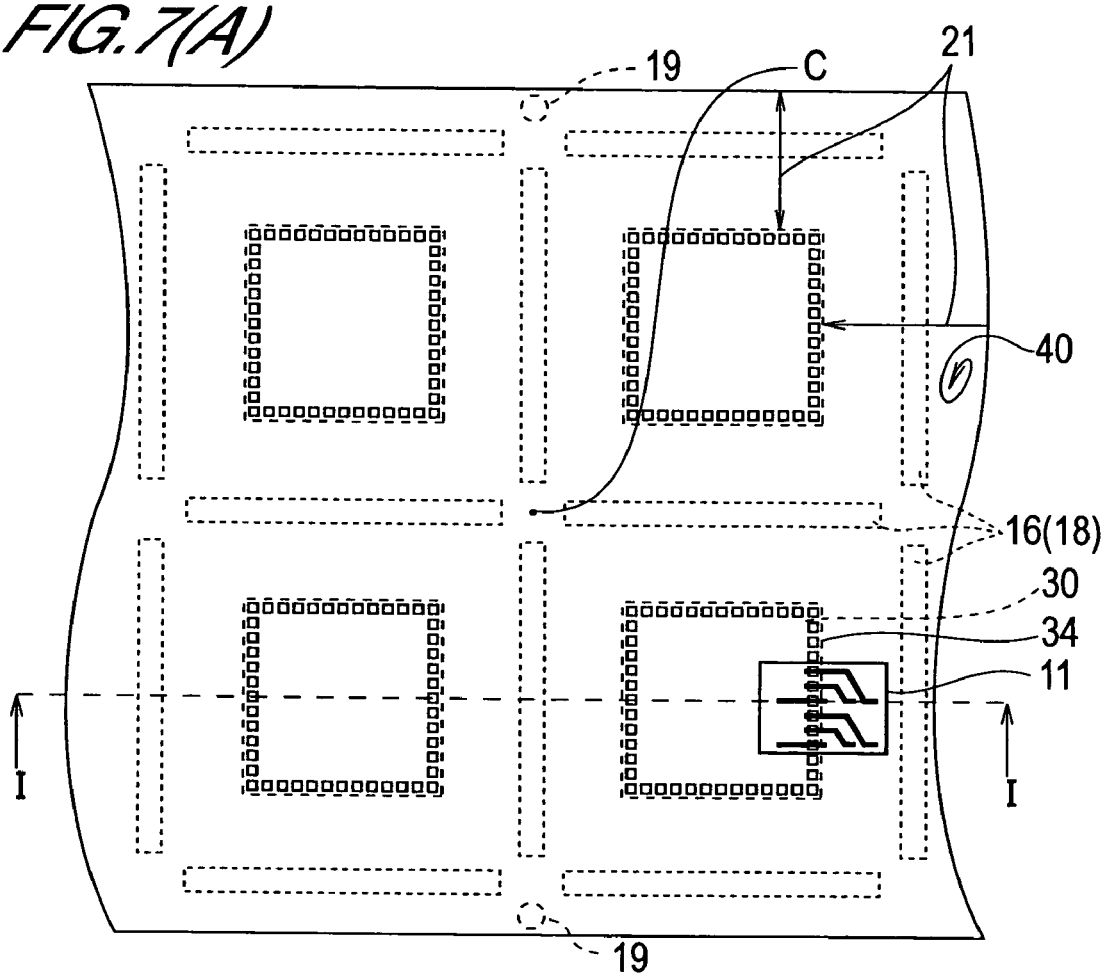
FIG. 7(A) is a schematic plan view seen from above for illustrating the first manufacturing method for the semiconductor device of this invention.
Figure 7B:
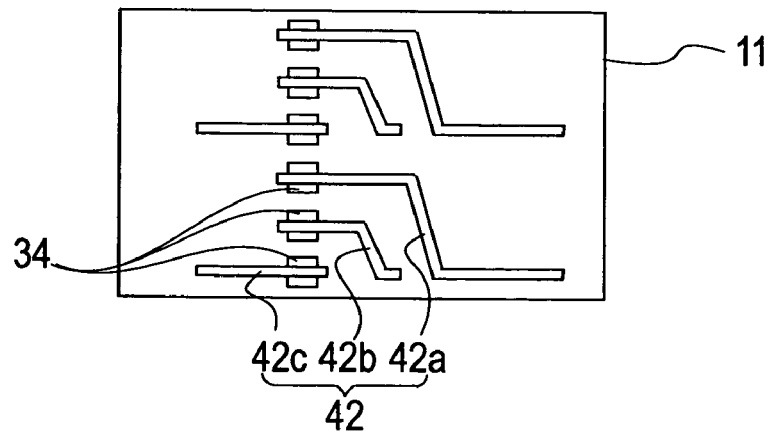
FIG. 7(B) is an expanded view of one region of (A)

Next, as shown in FIGS. 6(A), 6(B), and 6(C), the insulating film 40 is formed on the surface of the extension portion 20 and the first main surface 36. The insulating film 40 is formed such that the electrode pads 34 on the semiconductor chip 30 are at least partially exposed.

Here, a process may be used in which the insulating film 40 is formed to cover the electrode pads 34, whereupon the electrode pads 34 are exposed using a photolithography method or the like, for example.

As described above, a height difference may sometimes occur between the surface of the extension portion 20 and the surface of the semiconductor chip 30. An undulation or depression may also sometimes occur on the surface of the extension portion 20. In such cases, the insulating material for the insulating film 40 may be used to reduce this height difference such that wiring patterns can be formed in a subsequent step, or to make the insulating film 40 substantially even.

Formation of the insulating film 40 may be performed using an appropriate insulating material and by means of a method which is suited to the material of the extension portion 20, for example a well-known method such as spin coating, printing, or direct application.

Next, as shown in FIGS. 7 and 8, a plurality of wiring patterns 42 is formed on the surface of the insulating film 40. Formation of these wiring patterns 42 is performed following setting such that each wiring pattern 42 is electrically connected to a corresponding electrode pad 34 on the surface of the insulating film 40 and in consideration of the disposal of the external terminals to be formed at a later stage.

More specifically, the wire width, wire spacing, optimum angles, and so on are determined in accordance with applicable wiring process rules such that connections can be made at the shortest possible distances. As shown in the drawings, for example, a plurality of wiring pattern groups, each comprising a long wire 42a, a medium wire 42b, and a short wire 42c, is formed in respect of the plurality of electrode pads 34 formed around the peripheral edge of the semiconductor chip 30 at the shortest possible distances, and one end portion of each wire is connected to the corresponding electrode pad 34. An electrode post mounting pad is formed on the other end portion so that an external terminal 47 (solder ball 47a) can be connected thereto via an electrode post. In other words, each of the plurality of wiring patterns 42 is individually electrically connected to each of the electrode pads 34 on the insulating film 40 such that the electrode pads 34 are extended from the upper side of the first main surface 36 to the upper side of the first face 20a of the extension portion 20.

Note that to facilitate description, the disposed electrode pads 34 in FIGS. 4(A), 5(A) 6(A), and 7(A) are illustrated schematically in a smaller number than the actual number.

The wiring patterns 42 maybe formed by performing a wiring pattern formation process in a well-known WCSP manufacturing process such as sputtering or photolithography on the upper side of the extension portion 20 on the surface region of the insulating film 40, or in other words a desired region on the insulating film 40 including the extended region 21. The material used to form the wiring patterns 42 may be selected appropriately at will, but is preferably a material such as aluminum, copper, or a metal alloy. The wiring patterns 42 may be formed by selecting an appropriate material such as copper, for example.

Figure 9A:
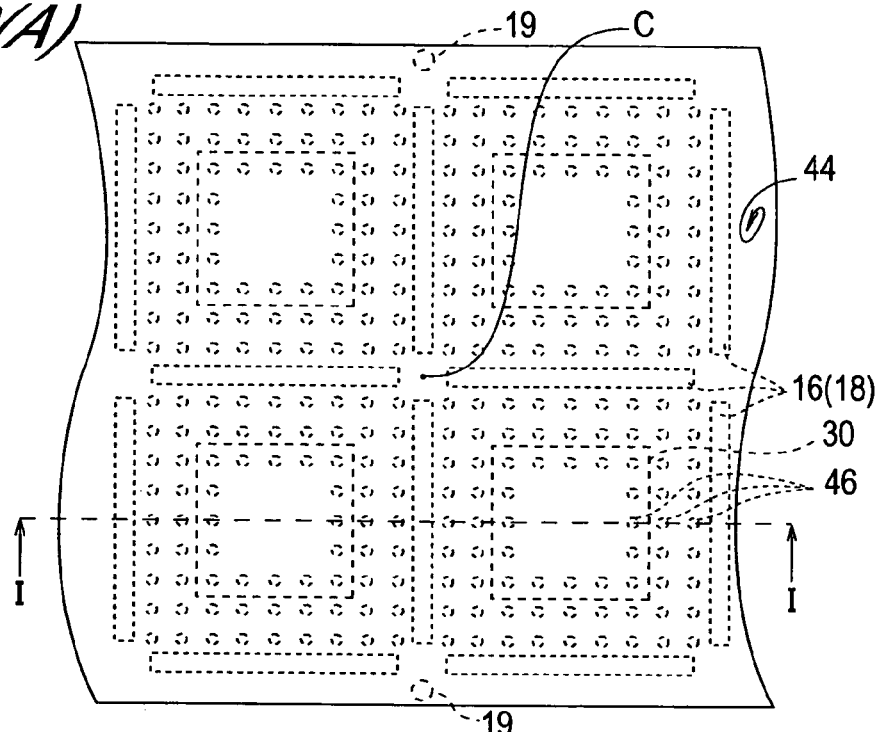
FIGS. 9(A), 9(B), and 9(C) are a schematic plan view seen from above and sectional views subsequent to FIGS. 7 and 8 for illustrating the first manufacturing method of the semiconductor device of this invention.
Figure 9B:
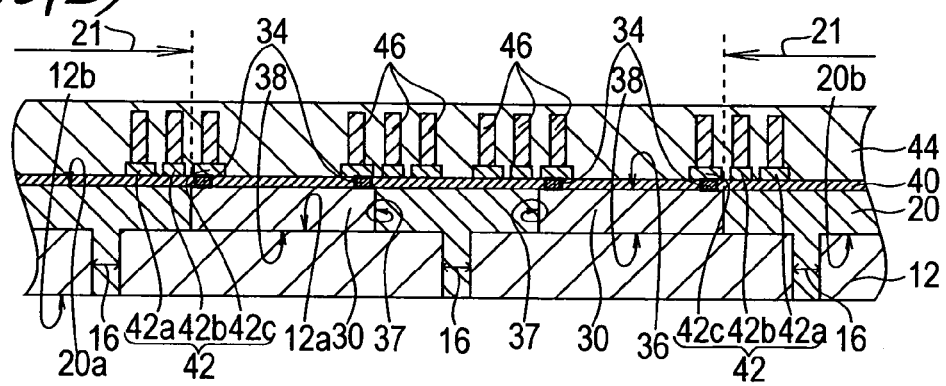
Figure 9C:
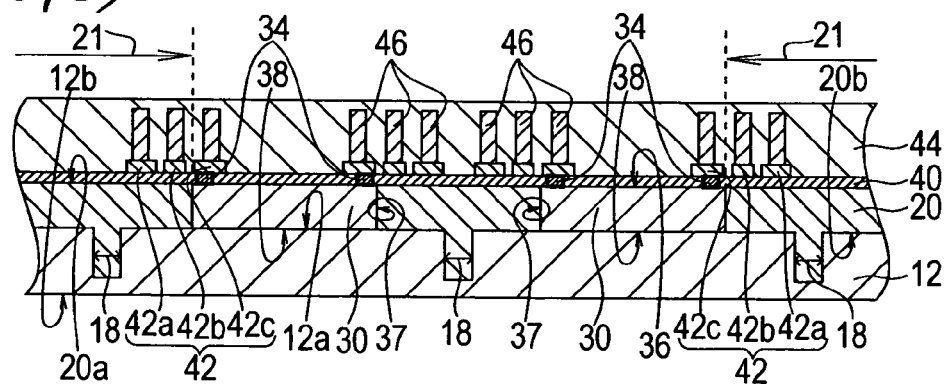

Next, as shown in FIGS. 9(A), 9(B), and 9(C), the electrode posts 46 are formed on the surface of each wiring pattern 42 so as to be electrically connected thereto. The electrode posts 46 are provided in the extended region 21 on the upper side of (directly above) the extension portion 20 and in the region near the extended region 21 on the upper side of (directly above) the semiconductor chip 30. The electrode posts 46 are formed in a lattice formation and arranged at predetermined intervals. As described above, these intervals may be set in consideration of mounting, or in other words as either constant or irregular intervals.

After an appropriate material has been selected, the electrode posts 46 may be formed by means of an electrode post 46 forming process in a well-known WCSP manufacturing process such as plating or photolithography.

The sealing portion 44 is formed so as to cover the surface of the insulating film 40 on which the wiring patterns 42 and electrode posts 46 are formed. The sealing portion 44 is formed such that a part of the extended parts of the wiring patterns 42 (or the wiring patterns 42 themselves when electrode posts are not formed) is exposed.

This sealing process may be implemented by means of a well-known method using a well-known sealing material such as an epoxy mold resin.

A mold resin generally used here has the following property values, for example: a linear expansion coefficient at a lower temperature than glass transition temperature within a range of 0.6 to $1.3 \times 10^{-5}/°$ C.; a glass transition temperature (Tg) within a range of 125 to 220° C.; and a modulus of elasticity within a range of 9.8 to 24 GPa (1000 to 2450 kg/mm$^2$). These values may be favorably applied to the semiconductor device 10 of this invention.

As described above, and particularly when the extension portion 20 is formed from a so-called mold resin similarly to the sealing portion 44, the material is determined such that the molding shrinkage of the mold resin used to form the extension portion 20 is larger than that of the sealing portion 44 in order to prevent warping of the semiconductor device 10 during the manufacturing process. The following combinations can be cited as examples of the properties of the mold resin used for the extension portion 20 and sealing portion 44.

(1) Extension portion/sealing portion: the properties of the extension portion mold resin are a linear expansion coefficient at a lower temperature than glass transition temperature within a range of 1.1 to $1.5 \times 10^{-5}/°$ C. and a glass transition temperature (Tg) which is larger than 170° C.; the properties of the sealing portion mold resin are a linear expansion coefficient at a lower temperature than glass transition temperature of less than $1.0\times10^{-5}/°$ C., a glass transition temperature (Tg) within a range of 125 to 220° C., and a modulus of elasticity within a range of 14.7 to 24 GPa (1500 to 2450 kg/mm$^2$).

(2) Extension portion/sealing portion: the properties of the extension portion mold resin are a linear expansion coefficient at a lower temperature than glass transition temperature within a range of 1.1 to $1.7\times10^{-5}/°$ C., a glass transition temperature (Tg) which is lower than 170° C., and a modulus of elasticity within a range of 9.8 to 19.6 GPa (1000 to 2000 kg/mm$^2$); the properties of the sealing portion mold resin are a linear expansion coefficient at a lower temperature than glass transition temperature of less than $1.0\times10^{-5}/°$ C., a glass transition temperature (Tg) within a range of 125 to 220° C., and a modulus of elasticity within a range of 14.7 to 24 GPa (1500 to 2450 kg/mm$^2$).

(3) Extension portion/sealing portion: the properties of the extension portion mold resin are a linear expansion coefficient at a lower temperature than glass transition temperature within a range of 1.1 to $1.7\times10^{-5}/°$ C., a modulus of elasticity of 13.7 GPa (1400 kg/mm$^2$), and a glass transition temperature (Tg) within a range of 125 to 170° C.; the properties of the sealing portion mold resin are a linear expansion coefficient at a lower temperature than glass transition temperature of less than $1.0\times10^{-5}/°$ C., a glass transition temperature (Tg) within a range of 125 to 220° C., and a modulus of elasticity with in a range of 14.7 to 24 GPa (1500 to 2450 kg/mm$^2$).

Figure 10A:
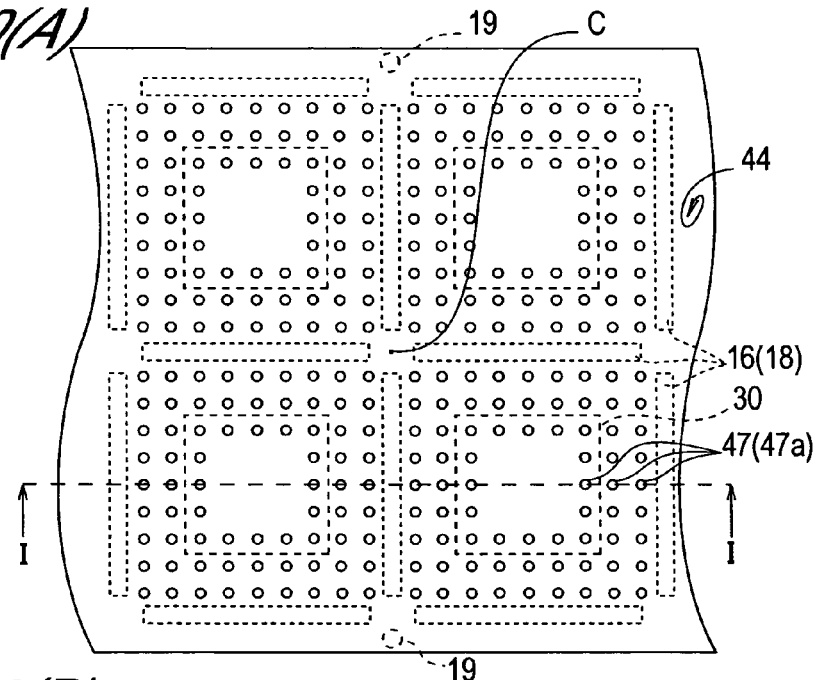
FIGS. 10(A), 10(B), and 10(C) are a schematic plan view seen from above and sectional views subsequent to FIG. 9 for illustrating the first manufacturing method of the semiconductor device of this invention.
Figure 10B:
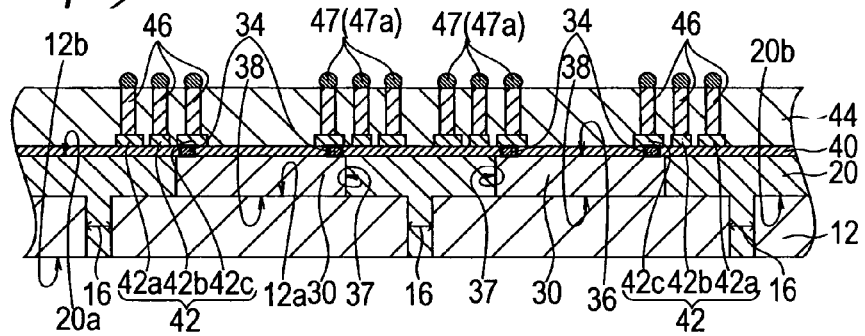
Figure 10C:
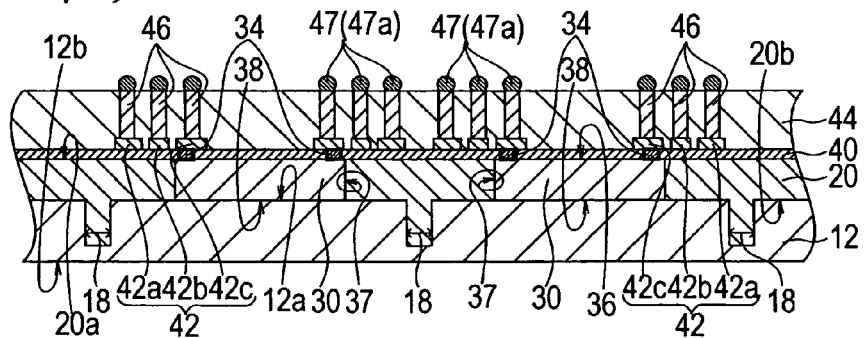

Next, as shown in FIGS. 10(A), 10(B), and 10(C), the surface side of the sealing portion 44 is trimmed such that the top surface (also referred to as the upper face) of the electrode posts 46 is exposed.

This process may be performed using a well-known grinding or polishing process.

A method such as film formation may also be applied to the formation of the sealing portion 44. In this case, substantially no load is placed on the electrode posts 46. Also in this case, the sealing portion 44 can be formed such that the top surface of the electrode posts 46 is directly exposed on the surface of the sealing portion 44 without the need for a grinding process on the sealing portion 44 as described above.

At this time, any suitable processing required from a design point of view may be performed on the exposed top surface of the electrode posts 46. If copper is used as the material for the electrode posts 46, for example, an Ni (nickel) film or the like may be formed on the top surface of the electrode posts 46 as a barrier metal layer.

The plurality of external terminals 47 is formed on the wiring patterns 42 in the region including the upper side of the extension portion 20 so as to be individually electrically connected to the extended part of the wiring patterns 42, or in other words the exposed part thereof.

In this constitutional example, solder balls 47a, for example, are formed as the external terminals 47 on the upper face of the electrode posts 46 which are exposed through the surface of the sealing portion 44.

Figure 11A:
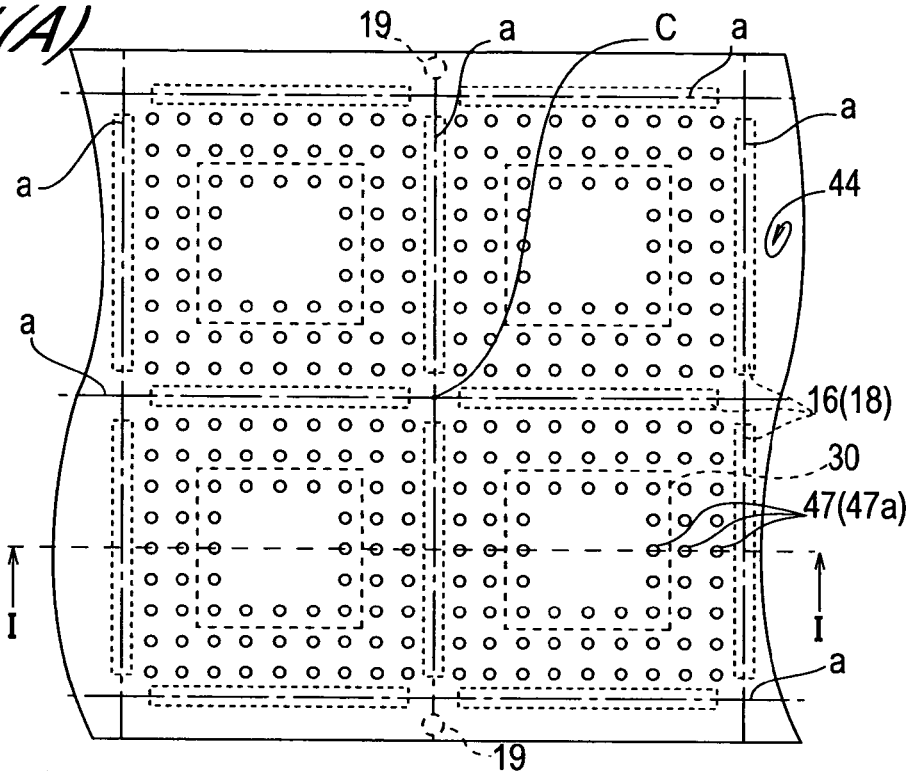
FIGS. 11(A), 11(B), and 11(C) are a schematic plan view seen from above and sectional views subsequent to FIG. 10 for illustrating the first manufacturing method of the semiconductor device of this invention.
Figure 11B:
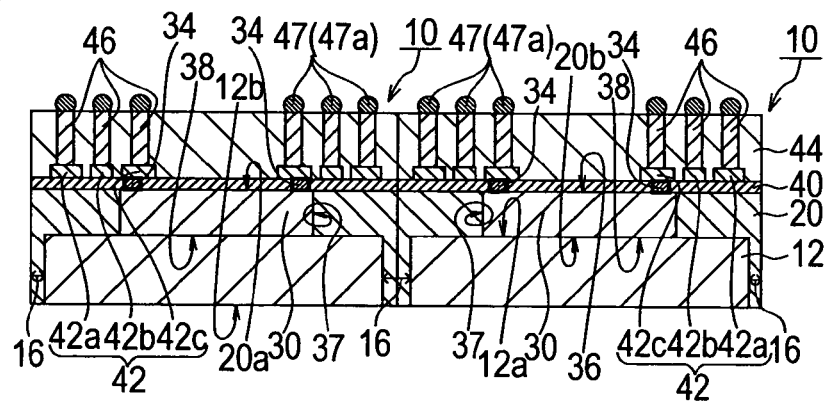
Figure 11C:
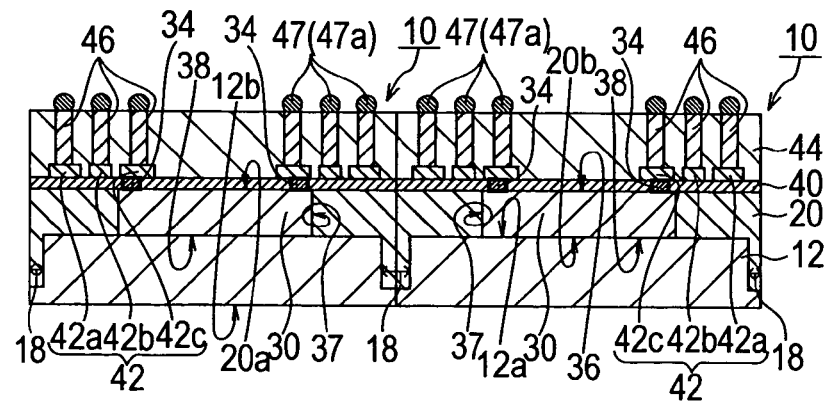

Next, when it is possible to use the position alignment marks 19 formed on the base 12, the coordinates of the position alignment marks 19 are used as a reference to adjust the cutting position, and once position alignment is complete, the plurality of semiconductor chips 30 are severed along the cutting line indicated by the dot/dash line a as shown in FIGS. 11(A), 11(B), and 11(C) so as to pass through the through holes 16 or groove portions 18 serving as the construction for aiding singularization. In so doing, the base 12 is cut into individual semiconductor devices exhibiting a predetermined function.

This singularization process is preferably performed using a blade or the like which rotates at high speed, for example.

In the description of the manufacturing method for the semiconductor device of this invention, an example was illustrated in each of the drawings in which a plurality of semiconductor devices 10 is manufactured simultaneously by disposing a plurality of semiconductor chips in a 2 (vertical)×X (horizontal, X being a positive number of no less than 2) lattice formation on the base 12. However, this invention is not limited thereto, and semiconductor devices may be manufactured simultaneously in a similar manner to a conventional semiconductor device manufacturing method using a silicon wafer, for example, by arranging a larger number of semiconductor chips in a larger lattice formation, for example, on the base (wafer) 12.

Since a WCSP manufacturing process can be applied to the first manufacturing method, the semiconductor device 10 can be manufactured without the need for any special manufacturing processes for the semiconductor device 10.

Further, since the construction for aiding singularization is formed on the base 12, the singularization process of the semiconductor device in particular can be performed extremely easily.

When the base is formed from a metallic material, for example, in consideration of thermal conductivity and thermal radiation, the amount of burrs (shavings) of the metallic material, which are inevitably produced during implementation of the singularization process, can be reduced. Accordingly, electrical short circuits caused when the burrs of the metallic material become attached between circuits on the mounting substrate or between terminals on electronic components, and defects such as malfunctions caused by these short circuits can be reduced greatly. Irregularities in the outer form of the manufactured semiconductor devices can also be reduced.

Further, from among the cutting devices used in the singularization process, wear in cutting means which cut the base while in contact therewith, such as a blade, can be even further reduced, and thus the effect of a further reduction in the manufacturing costs of the semiconductor device can be expected.

In addition, by forming the position alignment marks on the base, formation of the construction for aiding singularization, disposal of the semiconductor chip on the base, and singularization can be performed with a high degree of precision on the basis of the coordinates of the position alignment marks.

Next, a second manufacturing method for the semiconductor device of this invention will be described with reference to FIGS. 12(A) through 13(C). Note that in the following manufacturing processes, the applied materials, process implementation conditions, and so on are similar to those in the first method and hence detailed description thereof has been omitted.

Each drawing is a schematic sectional view for illustrating each manufacturing process in the second manufacturing method. The plan view for each drawing is similar to the drawing described in the first manufacturing method, and hence illustration and detailed description thereof have been omitted. Here, the constitutional example of a semiconductor device shown in FIG. 2(D) will be used as a representative example and described with ongoing comparison to the other constitutional examples.

The position alignment marks 19 described above are formed in advance on the base 12. The semiconductor chip disposal regions 14 on which the semiconductor chips 30 will be placed are set on the base 12. The profile of the semiconductor chip disposal region 14 substantially matches the profile of the semiconductor chip 30. The intervals between adjacent semiconductor chip disposal regions 14 are set to be equal. This interval is preferably set to a sufficient value in consideration of the surface area of the margin required when the semiconductor devices 10 are divided into individual units in the singularization process to be described below, the surface area of the surface region of the extension portion which is formed in accordance with the desired number of external terminals, and so on.

The through holes 16 (FIG. 3(B)) or groove portions (FIG. 3(C)) (not shown here) serving as the construction for aiding singularization described using FIGS. 3(A) to 3(C) are formed on the basis of the disposal position of the semiconductor chip disposal region 14.

Next, a plurality of the semiconductor chips 30 is disposed on the set semiconductor chip disposal regions 14 on the base 12 using the coordinates of the position alignment marks 19 as a reference to perform position alignment into appropriate disposal positions.

As shown in FIG. 12(A), extension portion material 20' for forming the extension portion 20 is provided on the base 12. Requirements for the extension portion material 20' such as properties and the like are similar to those of the first method, and hence detailed description thereof has been omitted.

The extension portion material 20' is provided on the base 12 so as to form the concave portion 22 in which the semiconductor chip will be provided subsequently. The concave portion 22 is formed comprising the bottom face portion 22a which matches the profile of the semiconductor chip disposal region 14. A thickness d3 of the concave portion 22 on the bottom face portion 22a side may be set appropriately in consideration of the thermal radiation property and so on of the semiconductor chip 30 to be provided subsequently, for example.

When the semiconductor device 10 is constituted as shown in FIGS. 2(A) and 2(B) described above, the extension portion material 20' is preferably provided such that the semiconductor chip disposal region 14 is exposed on the base 12.

The applicable method for forming the extension portion 20 is as described in the first manufacturing method, and hence detailed description thereof has been omitted.

When the semiconductor device 10 is constituted as shown in FIGS. 2(C) and 2(D), the extension portion material 20' is applied to the entire surface of the base 12 at an equal thickness to the thickness d3 of the concave portion 22 on the bottom face portion 22a side using a dispensing method, precision printing method, photolithography method, or similar to thereby form the extension portion 20 comprising the concave portion 22 by means of a one-step or two-step process. At this time, the extension portion 20 is preferably formed using the coordinates of the position alignment marks 19 as a reference.

At this time, the inside walls 24 having an inclined form which becomes gradually thinner toward the semiconductor chip 30 side may be formed in the concave portion (opening portion) 22 of the extension portion 20 according to the curing conditions of a curing process. The inside walls 24 may be formed using a standard curing process, for example. The inclined inside walls 24 may preferably be formed by heating the insulating material 20' to a higher temperature than is appropriate for initial curing and for an amount of time at which only the surface side of the material is cured, for example, and then curing the interior of the material (layer) at an appropriate temperature.

The inside walls 24 which become gradually thinner toward the semiconductor chip 30 side may also be formed by a masking, exposure, and development process in a photolithography method, for example. By forming the inclined inside walls 24 using a photolithography method, the angle of the incline may easily be set more precisely.

Next, as shown in FIG. 12(B), the semiconductor chip 30 is provided within the concave portion 22 of the extension portion 20 by sliding the semiconductor chip 30 along the surface of the inclined inside walls 24 using the coordinates of the position alignment marks 19 as a reference.

Note that when the semiconductor device 10 is constituted as shown in FIGS. 2(A) and 2(C) without the inclined inside walls 24, the extension portion material 20' may be cured after the semiconductor chip 30 is provided using the coordinates of the position alignment marks 19 as a reference such that the extension portion 20 is formed with the semiconductor chip 30 provided on the semiconductor chip disposal region 14 or in the concave portion 22.

When the semiconductor device 10 is constituted as shown in FIGS. 2(C) and 2(D), the faces of the semiconductor chip 30 other than the first main surface 36, or in other words the side surfaces 37 and second main surface 38, are surrounded by the extension portion 20. When the semiconductor device 10 is constituted as shown in FIGS. 2(A) and 2(B), the faces of the semiconductor chip 30 other than the first main surface 36 and second main surface 38, or in other words the side surfaces 37, are surrounded by the extension portion 20.

At this time, it is preferable that the level of the first main surface 36 be formed substantially equally to the level of the first face 20a of the extension portion 20 following curing processing.

Next, the insulating film 40 is formed on the first main surface 36 and the first face 20a of the extension portion 20.

The insulating film 40 is formed such that the electrode pads 34 on the semiconductor chip 30 are exposed.

Here, the electrode pads 34 may be exposed using a photolithography method or the like after the insulating film 40 has been formed covering the electrode pads 34 or after the material of the insulating film 40 has been provided.

As described above, a height difference may occur on the boundary between the first face 20a of the extension portion 20 and the first main surface 36 of the semiconductor chip 30. Also, an undulation or depression may occur on the first face 20a of the extension portion 20. In such cases, the material for the insulating film 40 may be used to reduce the height difference to an extent at which the wiring patterns 42 may be formed subsequently, or to form the insulating film 40 evenly.

Formation of the insulating film 40 is preferably implemented using a suitable material which corresponds to the material and so on of the extension portion 20, and by selecting an appropriate method. For example, the insulating film 40 forming step may be implemented using a well-known method such as spin-coating, printing, or direct application.

Next, as shown in FIG. 12(C), the plurality of wiring patterns 42 is formed on the surface of the insulating film 40.

The wiring patterns 42 may be formed so as to include patterns in a region leading from the upper side of (directly above) the first main surface 36 to the upper side of (directly above) the first face 20a of the extension portion 20 by means of a wiring pattern formation process in a well-known WCSP manufacturing process such as sputtering or photolithography using an appropriately selected material such as copper, aluminum, or a metal alloy, for example.

Next, as shown in FIG. 13(A), the plurality of electrode posts 46 is formed in a lattice formation and at a predetermined pitch on the surface of the wiring patterns 42 in a region corresponding to the upper side of (directly above) the extension portion 20, or in other words a region including the extended region 21. The pitch of the plurality of electrode posts 46 may be set in consideration of mounting as described above, or in other words as either a constant or irregular pitch.

After an appropriate material has been selected, the electrode posts 46 may be formed by means of an electrode post 46 forming process in a well-known WCSP manufacturing process such as plating or photolithography.

The sealing portion 44 is then formed so as to cover the wiring patterns 42 and electrode posts 46 formed on the extension portion 20 and semiconductor chip 30, or on the extension portion 20.

The sealing portion 44 forming step may be implemented by means of a well-known sealing method using a well-known sealing material such as an epoxy mold resin, for example.

Requirements such as the properties of the mold resin to be applied are similar to those of the first embodiment and hence detailed description thereof has been omitted.

Examples of combinations of the properties of the mold resin used to form the extension portion 20 and sealing portion 44 are also similar to those of the first method, and hence description thereof has been omitted.

Next, as shown in FIG. 13(B), the surface side of the sealing portion 44 is trimmed such that the top surface (also referred to as the upper face) of the electrode posts 46 is exposed.

This step is performed using a well-known grinding or polishing process.

Solder balls 47a, for example, serving as the external terminals 47 are then formed via the electrode posts 46 exposed on the surface of the sealing portion 44 on the upper face thereof.

Next, as shown in FIG. 13(C), adjacent semiconductor chips are severed through the through holes 16 or groove portions 18, not shown in the drawing, serving as the construction for aiding singularization using the coordinates of the position alignment marks 19 as a reference to gradually adjust the cutting position (See FIG. 11(A)), thereby providing individual semiconductor devices exhibiting a predetermined function.

This singularization process is preferably performed by cutting using a blade which rotates at high speed.

According to this second manufacturing method, in addition to the effects obtained by the first method described above, the semiconductor device 10 can be manufactured by a simple process such that the second main surface 38 side of the semiconductor chip 30 is particularly effectively protected by the extension portion 20.

In all embodiments of this invention, the electrode posts 46 are preferably formed from a conductive material. The electrode posts 46 are preferably formed from copper. A thin oxidation layer is preferably formed on the surface of the electrode posts 46 at this time. In so doing, the adhesive property between the electrode posts 46 and the sealing portion 44 is improved, thereby improving resistance to moisture.

In the semiconductor device of this invention, a partial region of the wiring patterns 42 having a certain length on or in the vicinity of boundary of the extended region 21 is preferably comprised of thicker and/or wider wire.

By forming this partial region of the wiring patterns 42 at which stress is considered more likely, due to such phenomena as thermal stress and particularly an edge effect, to be thicker in this manner, operational reliability in the semiconductor device 10 is improved.

In the semiconductor device 10 of this invention, the solder balls 47a are formed on the electrode posts 46 as the external terminals 47. A so-called BGA (Ball Grid Array) has been described, but this invention is not limited thereto. For example, a so-called LGA (Land Grid Array) or the like may be formed by applying and reflow soldering solder paste onto the exposed electrode posts 46 or by implementing Ni/Au processing by means of electroless plating.

More specifically, either a solder layer is formed directly on the surface of the exposed electrode posts 46, or a barrier metal layer is formed on the surface of the electrode posts 46 and then a gold (Au) plating layer is formed on the barrier metal layer. Alternatively, an Sn (tin) layer may be formed directly on the surface of the electrode posts 46 and used as an external terminal.

In the semiconductor device 10 of this invention, the electrode posts 46 are preferably formed from a conductive material such as aluminum or copper. The electrode posts 46 are preferably formed from copper. A thin oxidation layer is preferably formed on the surface of the electrode posts 46 at this time. In so doing, the adhesive property between the electrode posts 46 and the sealing portion 44 is improved, thereby improving resistance to moisture.

Further, in the semiconductor device 10 of this invention the sealing portion maybe formed not only in a so-called saw-cut form, but may also be formed not matching the profile of the base and/or the extension portion as long as the extent of this mismatch is within a range which does not impair the object of this invention.

What is claimed is:

1. A semiconductor device comprising:
   a semiconductor chip having a first main surface on which a plurality of electrode pads is provided, a second main surface which opposes said first main surface, and a plurality of side surfaces between said first main surface and said second main surface;
   an extension portion which includes a first face and a second face opposing said first face, and which is formed in contact with said side surfaces of said semiconductor chip to thereby surround said semiconductor chip and such that said first face is at a substantially equal level to the level of said first main surface;
   a base having a first surface and a second surface which opposes said first surface, said first surface contacting the second face of said extension portion and the second main surface of said semiconductor chip, which is capable of conducting heat generated by said semiconductor chip such that this heat is dispersed into the atmosphere from said second surface side;
   an insulating film which is formed on said first face and said first main surface such that a part of each of said plurality of electrode pads is exposed;
   a plurality of wiring patterns electrically connected to said electrode pads and extended from said electrode pads to the upper side of the first face of said extension portion, respectively;

a sealing portion which is formed on said wiring patterns and said insulating film such that a part of each of said wiring patterns is exposed; and a plurality of external terminals provided over said wiring patterns in a region including the upper side of said extension portion;

further comprising a plurality of electrode posts formed between said wiring patterns and said external terminals, wherein said sealing portion is formed such that the top surface of said electrode posts is exposed;

wherein said electrode posts are formed from a conductive material; and wherein a thin oxidation layer is formed on the surface of said electrode posts.

2. The semiconductor device according to claim 1, wherein said extension portion is formed from a material having greater molding shrinkage than the molding shrinkage of said sealing portion.

3. The semiconductor device according to claim 1, wherein said extension portion is formed from a liquid resin having a coefficient of linear expansion, within a lower temperature range than a glass transition temperature, of less than $1.5 \times 10^{-5}/°$ C. and a modulus of elasticity within a range of 7.8 to 22 GPa.

4. The semiconductor device according to claim 1, wherein said second face of said base is formed as a three-dimensional construction in which the surface area of said second face is increased.

5. The semiconductor device according to claim 1, wherein said base is formed from a material having a thermal conductivity of at least 150 W/m·K.

6. The semiconductor device according to claim 1, wherein said base is formed from either a metallic material selected from a group including copper (Cu), aluminum (Al), and a copper/tungsten alloy (CuW), or a ceramic material selected from a group including silicon carbide (SiC) and aluminum nitride (AlN).

7. A semiconductor device comprising:
a semiconductor chip having a first main surface on which a plurality of electrode pads is provided, a second main surface which opposes said first main surface, and a plurality of side surfaces between said first main surface and said second main surface;

an extension portion which includes a first face and a second face opposing said first face, and which is formed in contact with said side surfaces of said semiconductor chip to thereby surround said semiconductor chip and such that said first face is at a substantially equal level to the level of said first main surface;

a base having a first surface and a second surface which opposes said first surface, said first surface contacting the second face of said extension portion and the second main surface of said semiconductor chip, which is capable of conducting heat generated by said semiconductor chip such that this heat is dispersed into the atmosphere from said second surface side;

an insulating film which is formed on said first face and said first main surface such that a part of each of said plurality of electrode pads is exposed;

a plurality of wiring patterns electrically connected to said electrode pads and extended from said electrode pads to the upper side of the first face of said extension portion, respectively;

a sealing portion which is formed on said wiring patterns and said insulating film such that a part of each of said wiring patterns is exposed; and a plurality of external terminals provided over said wiring patterns in a region including the upper side of said extension portion;

wherein a portion of said wiring patterns on a boundary and vicinity thereof between a region on the upper side of said semiconductor chip and a region of said extension portion is formed wider or more thickly than other portions of said wiring patterns.

8. The semiconductor device according to claim 7, further comprising a plurality of electrode posts formed between said wiring patterns and said external terminals,
wherein said sealing portion is formed such that the top surface of said electrode posts is exposed.

9. The semiconductor chip according to claim 8, wherein said electrode posts are formed from a conductive material.

10. The semiconductor device according to claim 7, wherein said extension portion is formed from a material having greater molding shrinkage than the molding shrinkage of said sealing portion.

11. The semiconductor device according to claim 7, wherein said extension portion is formed from a liquid resin having a coefficient of linear expansion, within a lower temperature range than a glass transition temperature, of less than $1.5 \times 10^{-5}/°$ C. and a modulus of elasticity within a range of 7.8 to 22 GPa.

12. The semiconductor device according to claim 7, wherein said second face of said base is formed as a three-dimensional construction in which the surface area of said second face is increased.

13. The semiconductor device according to claim 7, wherein said base is formed from a material having a thermal conductivity of at least 150 W/m·K.

14. The semiconductor device according to claim 7, wherein said base is formed from either a metallic material selected from a group including copper (Cu), aluminum (Al), and a copper/tungsten alloy (CuW), or a ceramic material selected from a group including silicon carbide (SiC) and aluminum nitride (AlN).

* * * * *